United States Patent
Ichikawa

(10) Patent No.: US 8,723,409 B2
(45) Date of Patent: May 13, 2014

(54) LIGHT EMITTING DEVICE

(75) Inventor: Masatsuga Ichikawa, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/079,272

(22) Filed: Apr. 4, 2011

(65) Prior Publication Data

US 2011/0248623 A1    Oct. 13, 2011

(30) Foreign Application Priority Data

Apr. 7, 2010 (JP) ................................... 2010-88331
Apr. 9, 2010 (JP) ................................... 2010-90250

(51) Int. Cl.
*H05B 33/02* (2006.01)

(52) U.S. Cl.
USPC .......................................... 313/502; 313/501

(58) Field of Classification Search
USPC .................. 313/498, 501, 502, 512
See application file for complete search history.

(56) References Cited

U.S. PATENT DOCUMENTS

| | | | | |
|---|---|---|---|---|
| 6,953,952 | B2 * | 10/2005 | Asakawa | 257/103 |
| 2002/0084745 | A1 * | 7/2002 | Wang et al. | 313/498 |
| 2003/0008431 | A1 * | 1/2003 | Matsubara et al. | 438/98 |
| 2003/0230751 | A1 | 12/2003 | Harada | |
| 2006/0060867 | A1 | 3/2006 | Suehiro | |
| 2007/0064131 | A1 * | 3/2007 | Sawanobori et al. | 348/294 |
| 2007/0139949 | A1 | 6/2007 | Tanda et al. | |
| 2008/0211388 | A1 | 9/2008 | Okimura | |

FOREIGN PATENT DOCUMENTS

| | | |
|---|---|---|
| JP | 2001-148512 | 5/2001 |
| JP | 2002-141559 | 5/2002 |
| JP | 2002-299698 | 10/2002 |
| JP | 2003-347588 | 12/2003 |
| JP | 2004-56075 | 2/2004 |
| JP | 2005-285871 | 10/2005 |
| JP | 2006-108640 | 4/2006 |
| JP | 2007-80994 | 3/2007 |
| JP | 2007-165811 | 6/2007 |
| JP | 2007-234779 | 9/2007 |
| JP | 2008-205170 | 9/2008 |
| JP | 2009-004698 | 1/2009 |
| JP | 2009-200403 | 9/2009 |

* cited by examiner

*Primary Examiner* — Andrew Coughlin
(74) *Attorney, Agent, or Firm* — Morrison & Foerster LLP

(57) ABSTRACT

A light emitting device includes a housing member having a recess open upward, a light emitting element arranged in the recess and having a light emitting layer of a semiconductor, and a wavelength converting member arranged in the recess and capable of absorbing a part of light emission from the light emitting element and emitting light of different wavelength. The light emitting device is capable of mixing the light emission from the light emitting element and the light emission from the wavelength converting member to emit light from the opening of the recess. A light scattering surface for scattering light emission from the light emitting element and wavelength converting member is formed on at least part of the side surface of the recess. The light emitting element and the wavelength converting member are spaced apart from the side and bottom surfaces of the recess, and the side surfaces of the light emitting element are exposed without being covered with the wavelength converting member.

13 Claims, 7 Drawing Sheets

(a)

(b)

LIGHT EMITTING DEVICE

This application claims priority from Japanese Patent Application Nos. 2010-88331, filed Apr. 7, 2010, and 2010-90250, filed Apr. 9, 2010, the contents of which are incorporated herein by reference in their entireties.

BACKGROUND OF THE INVENTION

1. Technical field

The present invention relates to a light emitting device capable of color-mixing light emitted from a light emitting element and light obtained through wavelength conversion of a part of the original light emitted from the light emitting element, thereby emitting light of a different color.

2. Description of Related Art

A semiconductor light emitting element such as light emitting diode is small in size, has high power efficiency and emits light with clear color. The semiconductor light emitting element also has such advantages as almost free from blowout, excellent startup performance, and high durability to vibration and repetitive operations of turning on and off. There have been developed a light emitting device capable of emitting light of various wavelengths according to the principle of color mixing of light which is obtained by combining a source light emitted from a light emitting element and a wavelength converting member which is excited by the source light and is capable of emitting light of different wavelength than that of the source light. Such light emitting devices are used as various light sources. Particularly in recent years, such light emitting devices have attracted much attention as a next-generation illumination light sources of lower power consumption and longer service life to replace fluorescent lamps, and there is increasing needs for higher light emission output and improvements in light emitting efficiency. There is also a demand for light source of higher brightness in projectors such as automobile headlight and in floodlights.

For such light emitting devices, JP 2002-141559A proposes structures as shown in FIGS. 11(a) and 11(b). The light emitting semiconductor chip assembly 72 shown in FIG. 11(a) has a light emitting diode chip 74 fixed on a fluorescent material chip 74 through a transparent adhesive material 76. The fluorescent material chip 74 has a fluorescent material layer 82 on a base member 80 made of a transparent material such as silica or alumina or an opaque material having high light reflectivity. FIG. 11(b) shows a cross-sectional view of a light emitting device 92 constituted by using the light emitting semiconductor chip assembly 72. The light emitting device 92 has an anode lead 88 and a cathode lead 90, and the light emitting semiconductor chip assembly 72 is fixed in the cap portion 90a provided at an end of the cathode lead 90. An anode electrode 84 and a cathode electrode 86 of the light emitting semiconductor chip assembly 72 are respectively connected to the anode lead 88 and the cathode lead 90. The surroundings of the light emitting semiconductor chip assembly 72 is enclosed with a protective adhesive material 96 having a light scattering agent 94 dispersed therein.

The light emitting device shown in FIGS. 11(a) and 11(b) has the phosphor material chip 74 fixed on the back surface of the light emitting diode chip 78, which enables an increase in optical output compared to a light emitting device in which the back surface of the light emitting diode chip 78 is directly adhered in the cup portion 90a of the cathode lead. The reason for this is considered as below. In the case where the back surface of the light emitting diode chip 78 is directly adhered in the cup portion 90a of the cathode lead by using a silver paste and the like, light emitted from the back surface of the light emitting diode chip 78 is reflected by the silver paste. However, the reflectance of a silver paste is not sufficiently high and, in addition, a large proportion of the reflected light returns to the light emitting diode chip 8 and is absorbed, resulting in a decrease in the optical output. Adhering the fluorescent chip 74 on the back surface of the light emitting diode chip 78 decreases the ratio of the light emitted from the back surface of the light emitting diode chip 78 returning in the light emitting diode chip 78, so that the light can be efficiently extracted outside through the fluorescent material layer 82, and thus the optical output can be increased. Due to the effect of the light scattering agent 94 dispersed in the protective adhesive material 96, the colors of light emitted from the light emitting diode chip 78 and the fluorescent material chip 74 are mixed, so that color unevenness of emitted light can be suppressed.

However, with such a conventional light emitting device, sufficient improvement in both color unevenness and light emission output has been difficult to obtain. That is, to sufficiently reduce the color unevenness by mixing the colors of light emitted from the light emitting diode chip 78 and the fluorescent material chip 74, to some extent a large amount of the light scattering agent 94 is needed to be dispersed. However, if a large amount of the light scattering agent 94 is dispersed around the light emitting diode chip 78, the amount of light returning in the light emitting diode chip 78 after being reflected by the light scattering agent 94 increases, resulting in an increase in the ratio of light absorbed in the light emitting diode chip 78. Thus, if the amount of the light scattering agent 94 is increased to improve the color unevenness, then the light emission output decreases, and if the amount of the light scattering agent 94 is decreased to enhance the light emission output, then the color unevenness increases. Accordingly, an object of the present invention is to provide a novel light emitting device that can improve both the color unevenness and light emission output of the light emitting device at the same time.

SUMMARY

The invention provides a light emitting device that includes a housing member having a recess portion opening upward, a light emitting element disposed in the recess portion and having a light emitting layer including a semiconductor, and a wavelength converting member disposed in the recess portion between the light emitting element and a top plane of the recess portion and configured to absorb part of light emitted from the light emitting element, convert the absorbed light into light of a different wavelength and emit the converted light. The light emitted from the light emitting element and the light converted by the wavelength converting member are mixed and emitted from an opening of the recess portion. The device also includes a scattering surface provided on at least a portion of a side surface of the recess portion and configured to scatter the light emitted from the light emitting element and the light emitted from the wavelength converting member. The light emitting element and the wavelength converting member are apart from the side surface of the recess portion, and a side surface of the light emitting element is not covered by the wavelength converting member.

Exposing the side surfaces of the light emitting element from the wavelength converting member allows to decrease the absorption loss due to the wavelength converting member, so that the light extraction efficiency can be improved. Also, this decreases the probability of light emitted from a side surface of the light emitting element being reflected at the wavelength converting member and returning to the light emitting element, which also contributes to improve the light extraction efficiency. On the other hand, together with light propagated through the wavelength converting member, light directly extracted from the exposed side surfaces of the light emitting element to the outside of the wavelength converting member is scattered at the light scattering surface formed at the recess portion, then is extracted as mixed light from the opening at the top plane of the recess portion, so that occurrence of color unevenness can also be suppressed. In the present invention, both the light emitting layer of the light emitting element and the wavelength converting member are spaced apart from the side surface of the recess portion, so that the proportion of light scattered at the light scattering surface formed in the recess portion returning to the light emitting element and/or the wavelength converting member is small. Further, both the light emitting layer of the light emitting element and the wavelength converting member are spaced apart from the side surface of the recess portion, which facilitates light from the light emitting element and the wavelength converting member to be irradiated uniformly on a wider area of the light scattering surface formed in the recess portion, and thus color unevenness can also be satisfactorily suppressed.

According to the present invention, the light emitting element and the wavelength converting member are spaced apart from the side surface of the recess portion and the side surfaces of the light emitting element are exposed from the wavelength converting member so that light can be directly extracted from the side surfaces of the light emitting element, and a light scattering surface capable of scattering both the light from the light emitting element and the light whose wavelength has been converted by the wavelength converted member is formed on the side surface of the recess portion, and thus the light extraction efficiency can be enhanced while suppressing color unevenness.

DETAILED DESCRIPTION OF PREFERRED EMBODIMENTS

Figure 1:
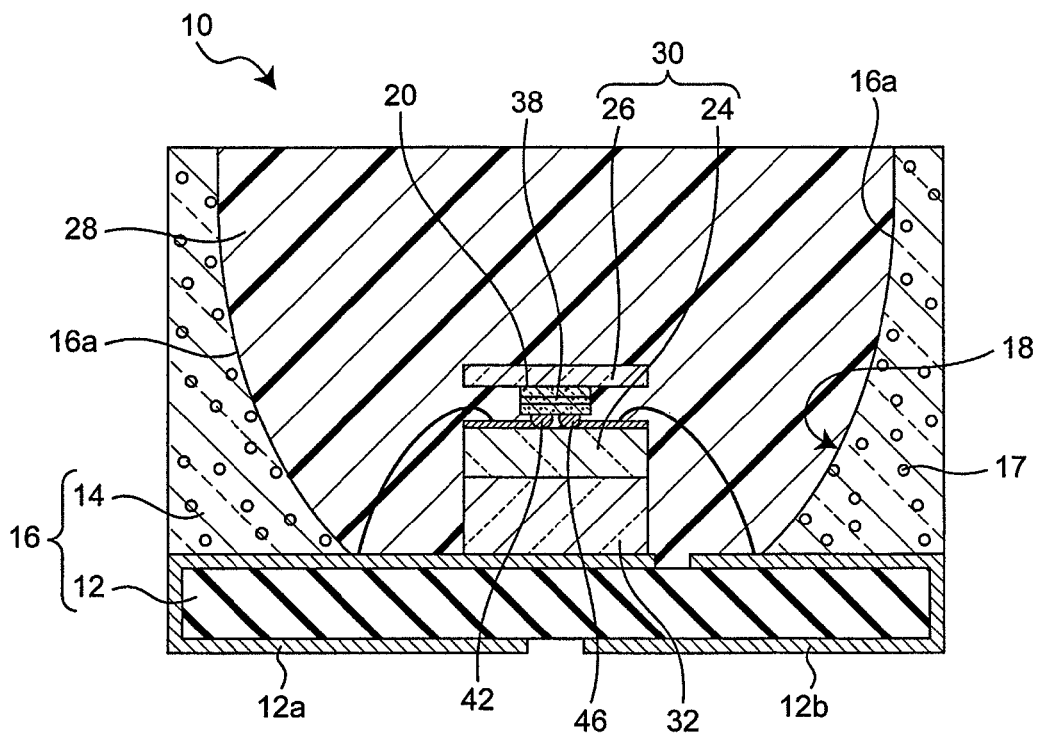
FIG. 1 is a schematic sectional view showing a light emitting device according to the first embodiment of the present invention.

Preferred embodiments of the present invention will be described below with reference to the accompanying drawings. The drawings show the objects schematically, and information included therein such as layout, dimensions, proportion and shape may be different from the actual. The members using the same reference numeral as that of another embodiment in the respective embodiments denote the same or corresponding members, and description thereof may be omitted.

In the present specification, the terms "up" and "down" are used also to indicate the side of the light emitting device where emitted light is extracted and the opposite side, respectively. For example, the term "upward" indicates the direction of the light emitting device where emitted light is extracted, and the term "downward" indicates the opposite direction. Also, the term "top surface" refers to the surface one the side of the light emitting device where light is extracted, and "bottom surface" refers to the surface on the opposite side. The term "inside" used in relation to the light emitting device refers to a position nearer to the light emitting layer of the light emitting device and the term "outside" refers to a position on the opposite side. The term "light transmissive" in the present specification refers to a transmissivity of 10% or more at an emission wavelength of the light emitting element. The term "mixing" of light means spatial mixing of light having different values of chromaticity so that the resultant light is perceived by the human eye as light having chromaticity different from that of each original light. The term "refractive index" refers to the refractive index at the emission wavelength of the light emitting element.

Figure 2:
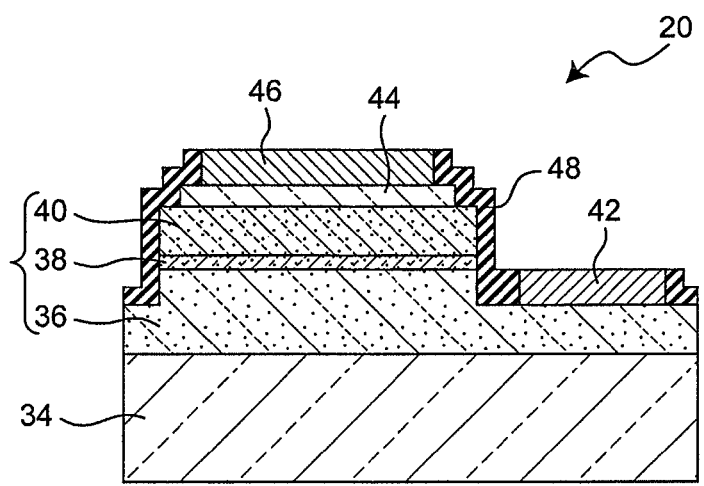
FIG. 2 is a schematic sectional view showing an example of a light emitting element used in the light emitting device of FIG. 1.

FIG. 1 is a schematic sectional view showing a light emitting device 10 according to the first embodiment of the present invention. A light emitting element 20 and a wavelength converting member 30 for absorbing a part of the light emitted from the light emitting element 20 and converting the wavelength of the light to a different wavelength are housed in a package 16 (housing member). The package 16 of the present embodiment is constructed of a mounting substrate 12 which is a planar insulating member having a wiring formed thereon and an annular side wall 14 formed on the mounting substrate 12. In top view, the package 16 has a rectangular external shape, and a circular cut is performed to form a circular inner side wall 14. The light emitting element 20 has a structure such as shown in FIG. 2, for example, which includes a light emitting layer 38 made of a semiconductor. Further, each of the two electrodes 42, 46 of the light emitting element 20 are connected to the respective wiring 12a, 12b of the mounting substrate 12 through an electrode formed on the wavelength converting member 30 and a wire, so that the current can be supplied from the outside.

Figure 7:
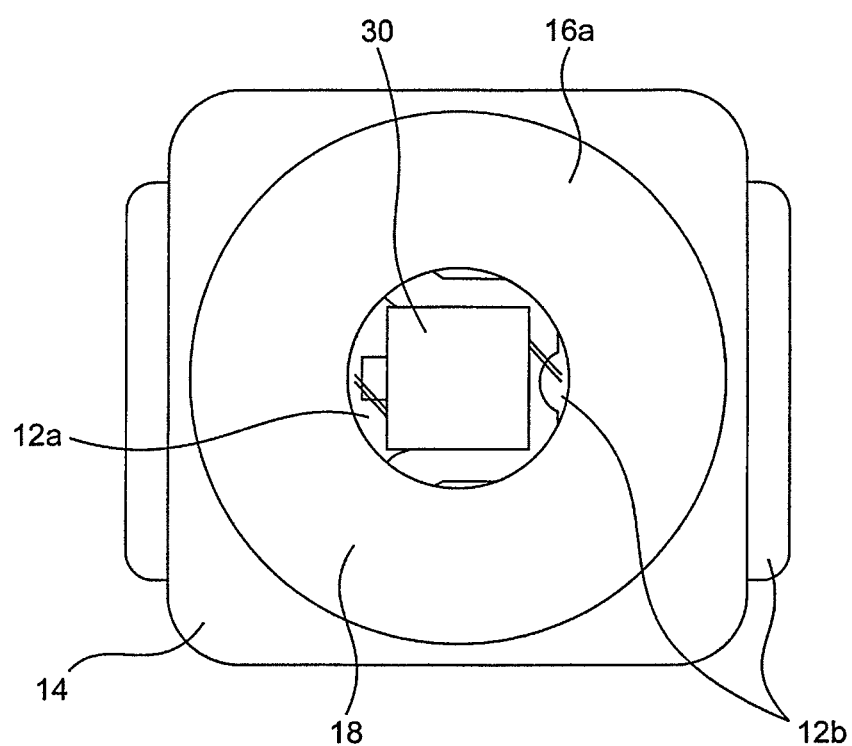
FIG. 7 is a schematic sectional view showing a light emitting device according to the first embodiment of the present invention.

A recess portion 16a opening upward is defined in the package 16 to house the light emitting element 20 and the wavelength converting member 30. Moreover, in the present embodiment, the recess portion 16a is formed in a mortar shape so that the light emission from the light emitting element 20 and the wavelength converting member 30 can be extracted efficiently. That is, the recess portion 16a is defined by the inner surface of the side wall 14 of the package 16 and the top surface of the mounting substrate 12, in which, the side wall 14 of the package has a circular shape with its inner diameter increasing upwardly. Thus, the recess portion 16a is formed in a mortar shape and the incident light on the surface of the recess portion 16a can be efficiently extracted from the top. Further, an optically transmissive sealing member 28 is filled in the recess portion 16a. The recess portion 16a of the package 16 shown in FIG. 1 has, as shown in FIG. 7, a circular shape in a plan view, and a rectangular light emitting element 20 (not shown) and a rectangular wavelength converting member 30 are arranged near the center. Also, the light emitting element 20 and the wavelength converting member 30 are disposed approximately in parallel with the bottom surface of the recess portion 16a.

The light emitting device 10 has a first wavelength converting member 24 disposed beneath the light emitting element 20 to support the light emitting element 20 and a second wavelength converting member 26 formed to cover the top surface of the light emitting element 20, as a wavelength converting member 30 capable of absorbing a part of the light emission of the light emitting element 20 and emitting light of different wavelength. The first wavelength converting member 24 and the second wavelength converting member 26 have a plate shape and the side surfaces of the semiconductor light emitting element 20 are exposed without being covered with the wavelength converting member 30, so that light can be extracted directly. The wavelength of a part of the light emitted from the top surface of the light emitting element 20 is mainly converted by the second wavelength converting member 26 and a part of the light emitted from the bottom surface of the light emitting element 20 is mainly converted by the first wavelength converting member 24. The wavelength-converted light as described above and the original light from the light emitting element 20 are mixed to obtain light emission of a desired color. For example, in the case where the light emitting element 20 emits blue light and the wavelength converting member 30 emits yellow light, a white light emission can be obtained by mixing them.

The light emitting device according to the present embodiment has a feature such that the side surfaces of the light emitting element 20 are exposed without being covered with the wavelength converting member 30. In the case of a conventional light emitting device in which the side surfaces of the light emitting element 20 are not covered with the wavelength converting member 30 but are simply exposed, light emitted from the side surfaces of the light emitting element 20 is extracted directly outside without propagating through the wavelength converting member 30, so that significant color unevenness may occur. Dispersing a light scattering agent such as a filler in the sealing member 28 enables to mix light of the light emitting element 20 and light of the wavelength converting member 30, so that color unevenness can be suppressed. However, if a light scattering agent of an amount sufficient to suppress color unevenness is dispersed in the sealing member 28, the proportion of light returning in the light emitting element 20 increases, which results in increasing the proportion of light absorbed in the light emitting element 20 and the light emitting output decreases.

Figure 6:
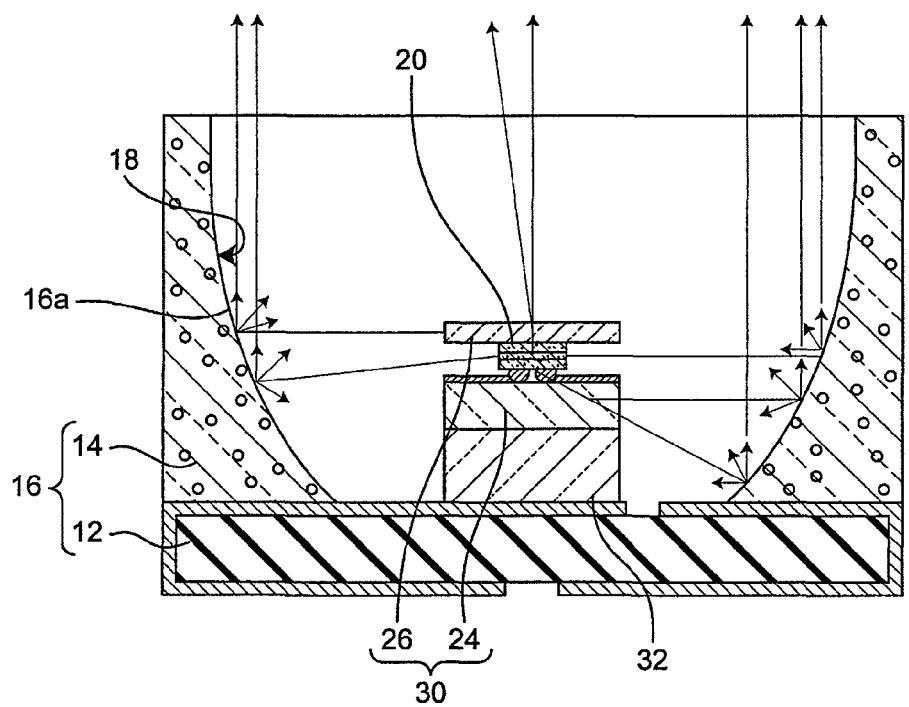
FIG. 6 is a schematic view illustrating the propagating directions of light in the light emitting device of FIG. 1.

For example, the side surface of the recess portion 16a can be formed as a light scattering surface 18 by dispersing light transmissive particles 17 such as $TiO_2$ in a light transmissive mother material which forms the side wall 14 of the package 16. That is, the particles 17 are dispersed in the side surface of the recess portion 16a and the light incident on the side surface is scattered by the particles 17. With this arrangement, as shown in FIG. 6, among the light emitted from the light emitting element 20 and the wavelength converting member 30, the light irradiated to the side surface of the recess portion 16a is scattered by the surface and then extracted to the outside, and in this light scattering process, the light from the light emitting element 20 and the light from the wavelength converting member are mixed, which suppresses the color unevenness. The side surface of the recess portion 16a is a beveled surface from the top edge toward the center of the recess portion, so that providing a light scattering surface on the beveled surface facilitates directing the scattered light toward the opening of the recess portion 16a.

That is, the light emitting device of the present embodiment has a structure in which the side surfaces of the light emitting element 20 are exposed without being covered with the wavelength converting member 30, and a light scattering surface 18 capable of scattering both the light from the light emitting element and the light whose wavelength being converted through the wavelength converting member 30, and accordingly the light extraction efficiency can be enhanced while suppressing color unevenness. Exposing the side surfaces of the light emitting element 20 from the wavelength converting member 30 enables extracting light of the light emitting element 20 without letting the light propagating through the wavelength converting member 30, so that loss due to absorption by the wavelength converting member 30 can be reduced and the light extraction efficiency can be improved. Also, this decreases the probability of light emitted from a side surface of the light emitting element being reflected at the wavelength converting member 30 and returning to the light emitting element 20, which also contributes to improve the light extraction efficiency. On the other hand, the light emitted from the exposed side surfaces of the light emitting element 20 is scattered at the light scattering surface 18 formed on the side surface of the recess portion 16a, and together with the light propagated through the wavelength converting member 30, which includes both the light emitted from the light emitting element and the wavelength converted light, extracted as a mixed light from the opening at the top plane of the recess portion 16a. Further, the light propagated through the wavelength converting member 30 and scattered by the scattering surface 18 is also extracted from the opening of the recess portion 16a as a mixed light. Accordingly, occurrence of color unevenness can also be suppressed.

Suppression of color unevenness and improvement of the light extraction efficiency obtained according to the light emitting device 10 of the present embodiment will be described in detail below. First, from the view point of suppression of color unevenness, it is preferable that the light emitted from the light emitting element 20 is extracted from the opening of the recess portion 16a after either propagating through the wavelength converting member 30 or scattered by the scattering surface 18. The above can be considered respectively as the light emitted from the light emitting element 20 propagating in an upward direction, a lateral direction, or a downward direction. In the present embodiment, the light which propagates upwardly from the light emitting element 20 directly to the opening of the recess portion 16a will reach the opening after propagating through the second wavelength converting member 26, and therefore, is mixed with the wavelength converted light by the second wavelength converting member. The light which is emitted from the light emitting element 20 in a lateral direction will be scattered together with the light emitted from the wavelength converting member 30 in a lateral direction by the light scattering surface 18 formed on the side surface of the recess portion, and be mixed with each other. The light emitted from the light emitting element 20 in a downward direction will be mixed with the light whose wavelength has been converted by the first wavelength converting member 24, while propagating through the first wavelength converting member 24. Accordingly, light emitted from the light emitting element 20 in any direction will be mixed with the light whose wavelength being converted by the wavelength converting member 30 and thus occurrence of color unevenness will be suppressed.

Meanwhile, from the view point of light extraction, in addition to the effect of reducing the light loss due to absorbing, exposing the side surfaces of the light emitting element 20 also has an effect of suppressing returning of light from the wavelength converting member 30 to the light emitting element 20. That is, in the case where the wavelength converting member 30 contains fluorescent particles having a size approximately similar to the emission wavelength of the light emitting element 20, the light from the light emitting element 20 is scattered by the fluorescent particles and return light to the light emitting element 20 occurs. Exposing the side surfaces of the light emitting element 20 from the wavelength converting member 30 eliminates occurrence of return light from the side surfaces due to scattering of light by the fluorescent particles, and thus self-absorption due to the return light can be reduced. Further, in the present embodiment, the side surface of the recess portion 16*a* is a light scattering surface, and the light emitting layer 38 of the light emitting element 20 and the wavelength converting member 30 are spaced apart from the side surface of the recess portion 16*a* of the package. Therefore, the proportion of the returning light to the light emitting element 20 and wavelength converting member 30 after being scattered at the side surface of the recess portion 16*a* is small. Specifically, defining the recess portion 16*a* with upwardly increasing inner diameter increases the amount of light travelling upward after being scattered at the side surface of the recess portion 16*a*, so that the proportion of light returning to the light emitting element 20 and the wavelength converting member 30 can be further reduced. As described above, forming the side wall 14 of the package 16 as a light scattering surface allows light to be extracted from the opening of the recess portion after being scattered at the side wall 14, so that there will be little decrease in the light emission output. Contrary to the above, in a conventional device, the light emission is scattered by coating the surroundings of the light emitting element 20 and the wavelength converting member 30 with a member in which a light scattering agent is dispersed, so that the scattered light tends to return in the light emitting element 20 and the wavelength converting member 30, which resulting in self-absorption of light.

Further, generally, the amount of heat generated during the operation of the light emitting element 20 is greater than that of the wavelength converting member 26. Accordingly, as in the present embodiment, exposing the side surfaces of the light emitting element 20 from the wavelength converting member 30 enables to suppress deterioration of the second wavelength converting member 26 caused by the heat generated by the light emitting element 20. That is, as in the present embodiment, exposing the side surfaces of the light emitting element 20 without covering the wavelength converting member 30 also decreases the contact area of the wavelength converting member 30 and the light emitting element 20, so that deterioration of the wavelength converting member 30 caused by the heat generated by the light emitting element 26 can also be suppressed.

Although it is also preferable in the present embodiment that the light scattering surface 18 formed on the surface of the recess portion 16*a* is formed as wide region as possible, the light scattering surface 18 is to be formed at least a portion of the side surface of the recess portion 16*a*, more preferably to be formed on the entire portion of the side surface thereof. With such arrangements, the color unevenness can be reduced efficiently. That is, the color unevenness may occur due to a difference in the length of optical paths of the light emitted from the light emitting element 20 propagating through the wavelength converting member 30. But the light emitted from the light emitting element 20 toward the bottom surface of the recess portion 16*a* is directly incident on the wavelength converting member 30, and accordingly, the lengths of the optical paths in the wavelength converting member 30 are relatively uniform, and thus color unevenness is unlikely to occur. On the contrary, the light obliquely propagating from the light emitting element 20 toward the side surface of the recess portion 16*a* obliquely propagates in the wavelength converting member 30 before emitted, so that color unevenness due to the difference in the length of the optical paths of the wavelength converting member 30 tends to occur.

Particularly, as in the present embodiment, in the case where the side surfaces of the light emitting element 20 are exposed without being covered with the wavelength converting member 30, color unevenness due to the light emitted from the side surfaces of the light emitting element 20 tends to occur. But, light emitted from the side surfaces of the light emitting element 20 is most likely incident in the regions facing the side surfaces of the light emitting layer 38 in the side surface of the recess portion 16*a*. Therefore, it is preferable that the light scattering surface is formed on the side surface of the recess portion 16*a* to specifically include the region facing the side surfaces of the light emitting layer 38. This arrangement enables to effectively reduce the color unevenness caused by the side surfaces of the light emitting element 20 being exposed without being covered with the wavelength converting member. More preferably, the light scattering surface is formed on the side surface of the recess portion 16*a* at least in the region which is reached by the light emitted from the wavelength converting member 30 and the light emitting element 20 in a direction approximately perpendicular to the optical axis of the recess portion 16*a* (that is, a direction approximately in parallel to the top plane of the recess portion 16*a*). That is, in the case of the present embodiment, it is preferable that the light scattering surface is formed on the side surface of the recess portion 16*a* in the regions upon which the light emitted from the side surfaces of the plate shape wavelength converting members 24, 26 in directions approximately perpendicular to the side surfaces is incident, and in the regions upon which the light emitted from the side surfaces of the light emitting element 20 in directions approximately in parallel with the light emitting layer 38 is incident. The wavelength converting member 30 may often be formed in a plate shape extending in a direction parallel to the principal surface of the light emitting element 20, and accordingly, the wavelength converted light emitted from the wavelength converting member 30 in lateral direction tends to have a relatively high intensity. Accordingly, forming the light scattering surface 18 also in the regions upon which the light emitted from the wavelength converting member 30 in a direction approximately parallel to the top plane of the recess portion 16*a* facilitates mixing of colors of light with the light emitted from the side surfaces of the light emitting element 20, and thus, color unevenness can be suppressed further efficiently The light scattering surface 18 is preferably provided on the regions facing the light emitting element 20 and the wavelength converting member 30 in an overlapping region upon which both the light emitted from the side surfaces of the light emitting element 20 and the light emitted from the side surfaces of the wavelength converting member 30 are directly incident. There may be a first region upon which only the light emitted from the sides surfaces of the light emitting element 20 is directly incident and/or a second region upon which only the light emitted from the side surfaces of the wavelength converting member 30 is directly incident over or below an overlapping region. Disposing the light scattering surface 18 on the first region upon which the light from the light emitting element 20 is strongly incident enables to scatter the light and mix the color of it with that of the light scattered at the overlapping regions and the second regions and then extract from the opening of the recess portion 16a, and accordingly, color unevenness can be suppressed. Disposing the light scattering surface 18 also on the second region upon which the light from the wavelength converting member 30 is strongly incident also enables to suppress color unevenness as well in the second region having strong incident of wavelength converted light. Further, the light emitted from the top surface of the light emitting element 20 propagates through the second wavelength converting member 26 and is extracted from the opening of the recess portion 16a, so that both the emission from the light emitting element 20 and the wavelength converted light are mixed and extracted from the opening of the recess portion 16a. In the present embodiment, the light emitted from the bottom surface of the light emitting element 20 propagates through the first wavelength converting member 24 and reaches the bottom surface or the side wall of the recess portion 16a. As in the case of an embodiment to be described later, a structure may be employed in which the first wavelength converting member 24 is not disposed beneath the light emitting element 20 so that the light emitted from the bottom surface of the light emitting element 20 directly reaches the bottom surface or the side wall of the recess portion 16a.

In the present embodiment, in order to obtain preferable color mixing of the light emission of the light emitting element 20 and the light emission of the wavelength converting member 30 by using the light scattering surface 18, it is advantageous that the light emission of the light emitting element 20 and the wavelength converting member 30 is irradiated on a wide area of the light scattering surface 18. For this, both the light emitting layer 38 of the light emitting element 20 and the wavelength converting member 30 are preferably spaced apart from the side surface and the bottom surface of the recess portion 16a. Further preferably, the light emitting element 20 and the wavelength converting member 30 are formed spaced apart from both the side surface and the bottom surface of the recess portion 16a. Disposing both the light emitting layer 38 and the wavelength converting member 30 spaced apart from the side surface and the bottom surface of the recess portion 16a enables to increase the region on the light scattering surface 18 upon which both the light emitted from the light emitting element 20 and the light from the wavelength converting member 30 are incident, and preferable mixing of the colors of light can be obtained. Further, in the case where both the light emitting layer 38 and the wavelength converting member 30 are spaced apart from the side surface and the bottom surface of the recess 16a, the proportion of the scattered light returning to the light emitting element 20 and the wavelength converting member 30 can be reduced, so that the light extraction efficiency can also be improved.

Figure 3:
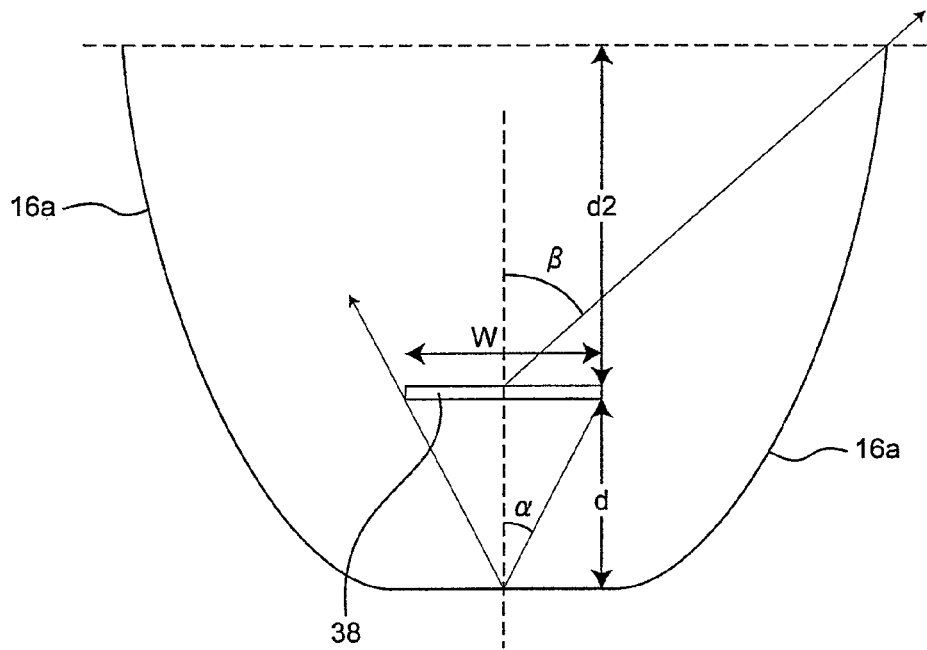
FIG. 3 is schematic view showing a positional relationship between the recess portion and the light emitting layer.

Particularly, in the case of the light emitting device 10 of the present embodiment, the light emitting element 20 is disposed in the recess portion 16a so that the light emitted from the bottom surface of the light emitting element 20 can be used efficiently. That is, as shown in FIG. 3, the light emitting layer 38 is disposed so that with the greatest width w (μm) of the light emitting layer 38 in the planar direction, the distance d from the light emitting layer 38 to the bottom surface of the recess portion 16a is at least 0.5 w (μm). According to the structure of the package 16, the bottom surface of the recess portion 16a may have a stacked layer structure, and in such a case, with the surface showing the strongest reflection of the light from the light emitting layer 38 as a standard surface, the distance d is indicated the distance from the surface to the light emitting layer 38. In the case where the distance from the light emitting layer 38 to the surface of the recess portion 16a at where the light to be reflected is too small, such as a case where the light emitting element 20 is directly fixed on the bottom surface of the recess portion 16a, most of the light emitted from the light emitting layer 38 returns to the light emitting element 20 and re-absorbed by the semiconductor layer or the electrode in the light emitting element 20. In the case of light emitted from the ends of the light emitting layer 38 and reflected at the bottom surface of the recess portion 16a, among the light downwardly emitted from the ends of the light emitting layer 38, the light incident to the bottom surface of the recess portion 16a at an incident angle α (the angle of the normal line to the bottom surface of the recess 16a and the light incident to the bottom surface) of 45° or greater can be extracted to the outside. Therefore, arranging the distance d from the light emitting layer 38 to the bottom surface of the recess portion 16a to be 0.5 w or greater facilitates the light downwardly emitted from the light emitting layer 38 to be emitted outside without returning to the light emitting element 20. A critical value of the incident angle α decreases as the distance d from the light emitting layer to the bottom surface of the recess increases, which facilitates extraction of the emission to the outside. The distance d from the light emitting layer 38 to the bottom surface of the recess portion 16a is preferably 1 w (μm) or greater, more preferably 2 w (μm) or greater. The light emitting layer 38 is preferably disposed at a location higher than one-third of the depth (distance from the bottom surface to the top surface of the recess portion) of the recess portion 16a. As described above, arranging the light emitting layer 8 in the light emitting element 20 sufficiently spaced apart from the bottom surface of the recess portion 16a decreases the probability of the light downwardly emitted from the light emitting layer 38 reflected at the bottom surface of the recess portion 16a and returning to the light emitting element 20, so that the emission of the light emitting element 20 can be used efficiently.

The position of the light emitting layer 38 in the recess portion 16a also affects the proportion of the light directly extracted outside from the opening of the package 16a with respect to the light emitted from the light emitting element 20 and the wavelength converting member 30. The proportion of light extracted to the outside without being incident on the side surface of the recess portion 16a decreases by arranging the light emitting layer 38 spaced apart from the top plane of the recess portion 16a, so that the effect of color mixing by scattering at the scattering surface 18 can be increased. With the greatest width w (μm) of the light emitting layer 38 in the planar direction, the light emitting layer 38 is preferably arranged so that the distance $d_2$ from the light emitting layer 38 of the light emitting element 20 to the top plane of the recess portion 16a is at least 0.5 w (μm), more preferably 1 w (μm) or greater. The distance $d_2$ is desirably larger than the distance d from the light emitting layer 38 to the bottom surface in the recess portion 16a. In the present specification, the term "top plane" of the recess portion 16a indicates the plane which includes the top edge defining the recess portion 16a. The indication of the "top plane" is applied in the same manner in other embodiments.

Further, as shown in FIG. 3, with β indicating the angle between the line passing the center of the light emitting layer 38 and a top edge defining the recess portion 16a and the optical axis (direction of the optical axis in the case where the recess portion serves as a reflective mirror without having scattering property) of the recess portion 16a, all the light which is upwardly emitted from the center of the light emitting layer 38 and which has an angle with respect to the optical axis of the recess portion 16a being less than β will reach the top plane of the recess portion 16a. Therefore, determining the relationship between the recess portion 16a and the light emitting layer 38 so that the above described angle β is small, the effect caused by the scattering at the surface defining the recess portion 16a can be enhanced, and thus preferable. The angle β is preferably 90° or smaller, and more preferably 70° or smaller. On the other hand, if the angle β is too small, the obtained light emitting device exhibits strong directivity which may be undesirable for some applications. Also, if the angle β is too small, the light emitted from the light emitting element 20 repeats scattering at the surface defining the recess portion 16a which increases the returning light to the light emitting element 20, and thus the optical output of the light emitting device 10 decreases. Therefore, the angle β is preferably 30° or greater, more preferably 50° or greater. The angle β can be adjusted by the distance $d_2$. The longer the distance $d_2$ is, the smaller the angle β is. The angle β can also be adjusted by increasing or decreasing the width of the opening of the recess portion 16a which is the light emitting portion. The smaller the width of the opening is, the smaller the angle β is. The light emitted from the top surface of the light emitting element 20 tends to have a high intensity in a direction approximately perpendicular to the surface of the light emitting element 20.

In the case where a sealing member is filled in the recess portion 16a, among the light reached the top plane of the recess portion 16a, the light incident on the top plane of the recess portion 16a at an angle equal or smaller than the critical angle $\theta_c$ for total reflection is directly extracted to the outside and the light incident on the top plane of the recess portion 16a at an angle larger than the critical angle $\theta_c$ is totally reflected and returned into the recess portion 16a. Therefore, in the case where the critical angle $\theta_c$ is smaller than the angle β, the amount of light which is directly extracted can be reduced and the light returned in the recess portion 16a by the total reflection can be scattered at the scattering surface, so that the color unevenness can be further improved. Forming the top surface of the sealing member in an approximately flat surface configuration enables to increase the total internal reflection on the surface of the sealing member. On the other hand, in the case where the critical angle $\theta_c$ is larger than the angle β, by setting the angles as $\theta_c \geq \beta$, the proportion of the light which is directly extracted increases, but it is preferable in view of the light extraction efficiency. Increasing the distance $d_2$ allows to reduce the proportion of the light beam reflected at an angle equal or larger than the critical angle $\theta_c$, and is thus preferable in view of the light extraction efficiency. The angle β can also be adjusted by increasing or decreasing the width of the opening of the recess portion 16a which is the light emitting portion. For example, decreasing the width of the opening enables to increase the proportion of light reaching the light scattering surface even with an increased distance $d_2$. On the other hand, increasing the proportion of the light beam reflected at an angle equal or larger than the critical angle $\theta_c$, that is, increasing the width of the light emitting portion or decreasing the distance $d_2$, for example as $d_2 < d$, enables to decrease the proportion of light which can be directly extracted, so that light returning in the recess portion 16a by total internal reflection can be scattered at the light scattering surface, and thus color unevenness can be further improved.

In order to prevent the return light to the light emitting element 20, the light emitting layer 38 of the light emitting element 20 is preferably sufficiently spaced apart from the side surface of the recess portion 16a, that is, from the light scattering surface. In a plane including the light emitting layer 38 of the light emitting element 20 and in parallel to the light emitting element 20, the light emitting layer 38 is preferably arranged so that with the greatest width w (μm) of the light emitting layer 38 in the planar direction, the shortest distance from the end of the light emitting layer 38 to the side surface of the recess 16a is preferably 0.5 w (μm) or greater, 1 w (μm) or greater, more preferably 3 w (μm) or greater.

Figure 4:
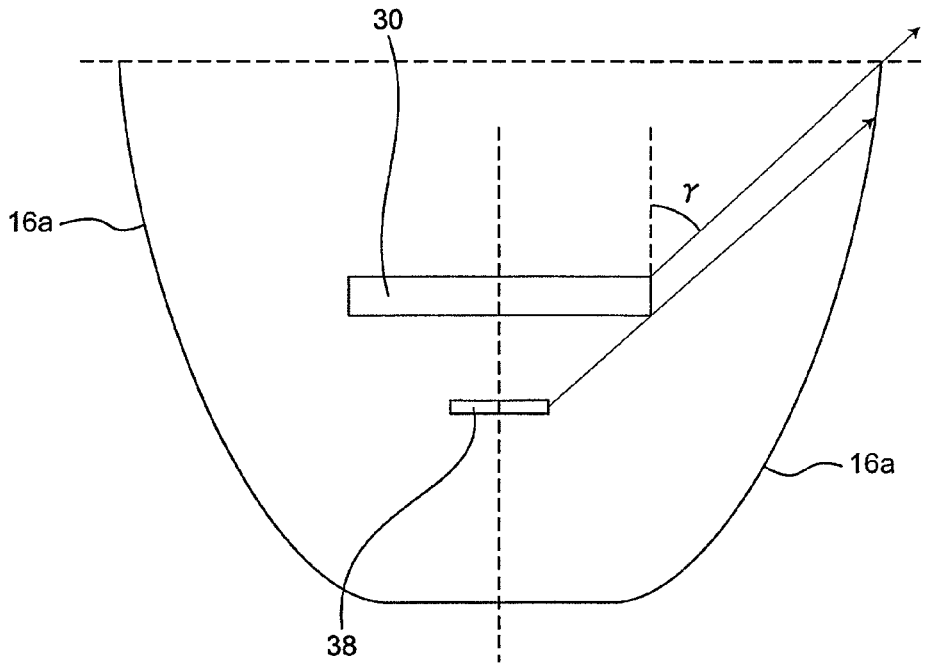
FIG. 4 is a schematic view showing a positional relationship between the recess portion and the wavelength converting member.
Figure 5:
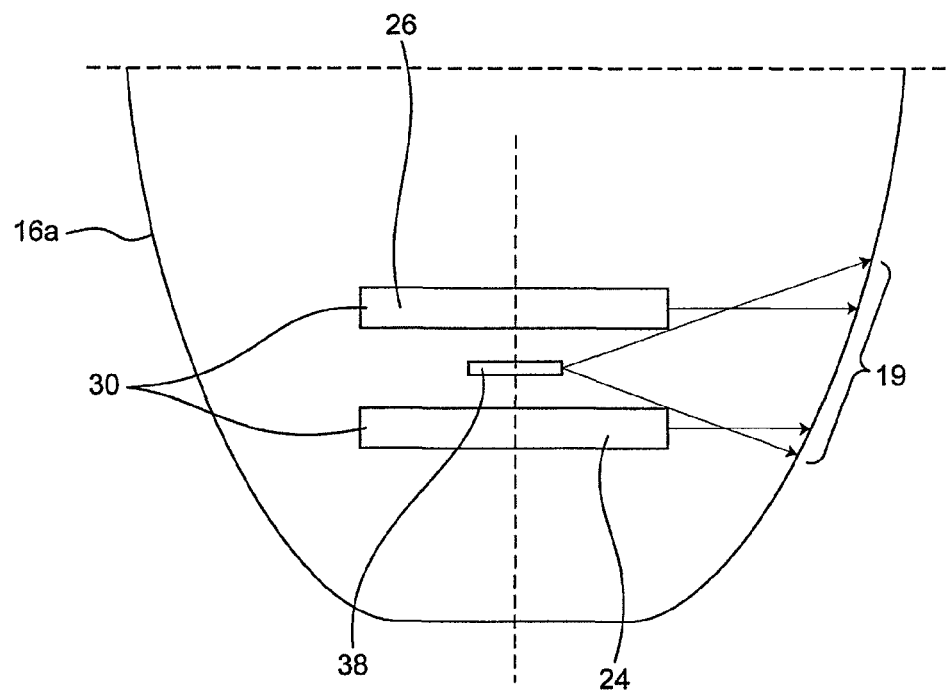
FIG. 5 is a schematic view showing a positional relationship between the recess portion and the wavelength converting member.

Further, as shown in FIG. 4, with γ indicating the angle between the line passing a top edge of a side surface of the wavelength converting member 30 and a top edge defining the recess portion 16a and a line perpendicular to the top plane of the recess portion 16a, with a small value of the angle γ, the light scattering surface facing the side surface of the wavelength converting member 30 can be enlarged, so that the proportion of light directly extracted outside from the side surface of the wavelength converting member 30 can be reduced. The angle γ is preferably 90° or smaller, and more preferably 70° or smaller. If the angle γ is too small, the proportion of scattered light returning to the wavelength converting member 30 and/or the light emitting element 20 increases, and thus the optical output of the light emitting device 10 decreases. Therefore, the angle γ is preferably 30° or greater, more preferably 50° or greater. Increasing the angle of slope of the light scattering surface enables to enlarge the region facing the side surfaces of the wavelength converting member 30. With this arrangement, the area for scattering the light emitted from the side surfaces of the wavelength converting member can be increased and thus color unevenness can be further suppressed. The arrangement and the size of the wavelength converting member 30 and the light emitting element 20 are preferably such that, as shown in FIG. 4 or FIG. 5, the light emitted from the side surfaces of the light emitting layer 38 and propagating outside of the wavelength converting member 30 is invariably incident on the recess portion 16a. With this arrangement, the light emitted from the exposed side surfaces of the light emitting element 20 can be scattered at the light scattering surface formed within the recess portion 16a.

Arranging the light emitting element 20 and the wavelength converting member 30 spaced apart from the side surface of the recess portion 16a and adjusting the distance of the separation enables further suppression of color unevenness. For example, as shown in FIG. 5, assuming the region 19 where the light emitted from the side surfaces of the light emitting layer 38 of the light emitting element is directly incident on, a region on which the light emitted from the side surfaces of the plate shape wavelength converting member 30 in approximately perpendicular direction reaches is preferably located within the region 19. The arrangement described above can be satisfied by disposing the light emitting element 20 and the wavelength converting member 30 sufficiently spaced apart from the side surface of the recess portion 16a. With the arrangement being satisfied, forming the light scattering surface 18 on the region 19 enables to efficiently mix the colors of light emitted from the side surfaces of the light emitting element 20 and the light propagated through the wavelength converting member 30, so that color unevenness can be effectively suppressed. Decreasing the size of the flange shape protrusion of the wavelength converting member 30 and/or increasing the distance between the wavelength converting member 30 and the light emitting layer 38 enables to increase the emission angle of the light emitted from the side surfaces of the light emitting layer 38 and directly incident on the side surface of the recess portion 16a and thus the region 19 can be enlarged. Herein, the top edge of the region 19 is preferably arranged at a position within the side surface of the recess portion 16a. With this arrangement, the light emitted from the light emitting element 20 cannot be directly emitted from the opening of the recess portion 16a, so that the direct light from the light emitting element 20 can be scattered at the light scattering surface 18 on the side surface of the recess portion 16a and is then mixed with the light emitted from the wavelength converting member 30 and is emitted from the recess portion 16a, and thus further improvement in color unevenness can be achieved.

In the case of the present embodiment, the light emitting element 20 is fixed to the package through the first wavelength converting member 24 and a supporting substrate 32 made of a light transmissive material such as sapphire. That is, the supporting substrate 32 is directly bonded on the top surface of the mounting substrate 12 which is the bottom surface of the recess portion 16a, and the first wavelength converting member is directly bonded on the supporting substrate 32, and the light emitting element 20 is directly fixed on the first wavelength converting member 24. The supporting member interposed between the light emitting element 20 and the mounting substrate 12 serves as a heat dissipation path from the light emitting element 20 toward the mounting substrate 12, so that they are preferably made of a material having high heat conductivity. For example, in the case of the present embodiment, both the first wavelength converting member 24 and the supporting member 32 are preferably made of materials having high heat conductivity. The first wavelength converting member 24 may be made of a resin with a fluorescent material dispersed therein. However, resins generally have low thermal conductivity, and in the case where a high output power light emitting element 20 is used, the resin may be deteriorated by the heat generated from the light emitting element 20, so that it may be difficult to maintain high output power for a long period of time. Accordingly, both the first wavelength converting member 24 and the supporting substrate 32 which are the supporting member interposed between the light emitting element 20 and the bottom surface of the recess portion 16a (that is, the top surface of the mounting substrate 12) are preferably formed with a main material having thermal conductivity of 0.8 (W/mK) or greater, more preferably 1.2 (W/mK) or greater, further preferably 35 (W/mK) or greater. With this arrangement, the heat dissipating efficiency of the light emitting element 20 can be enhanced, thus is realized a light emitting device 10 in which only a small decrease in its light emission output occurs even after a long-time operation. A member having low heat conductivity may be provided between the light emitting element 20 and the bottom surface of the recess portion 16a, as a thin film so as not to disturb the overall heat transfer. For example, the first wavelength converting member 24 and the supporting member 32 each having high heat conductivity may be bonded by an adhesion layer having low heat conductivity to the extent that the overall heat conduction is in the range described above. That is, in the case where the supporting member is made of a composite material, it is sufficient that the thermal conductivity as the whole supporting member is of a predetermined value or greater. In view of thermal contraction, the supporting member is desirably disposed at least one of the wirings 12a, 12b. Also, a heat dissipater such as a metal member which is insulated from the wirings may be provided and the supporting member 32 is disposed on the heat dissipater. The supporting member 32 and the wirings 12a, 12b are bonded by a resin, a metal paste, or the like. A metal paste having high heat conductivity is preferably used. In such case, a metal film is formed on the surface of the supporting member and a metal paste is applied to the metal film side for bonding. Thus, adhesion can be improved. The metal film can be used as a reflecting layer.

Further, the supporting member interposed between the light emitting element 20 and the recess portion 16a to support the light emitting element 20 is preferably optically transmissive so as not to absorb the light emission of the light emitting element 20. A member having low heat conductivity may be provided between the light emitting element 20 and the bottom surface of the recess portion 16a, as a thin film so as not to disturb the overall heat transfer. For example, the light transmissive first wavelength converting member 24 and the light transmissive supporting member 32 may be bonded with an adhesive layer with low light transmissiveness, as long as the overall light transmissive property of the entire supporting member is not disturbed. In the case where such a member having low light transmissivity is interposed between the light emitting element 20 and the bottom surface of the recess portion 16a, the low light transmissive member is preferably disposed with a smaller width than the first wavelength converting member 24, and further preferably with a smaller width than the light emitting layer 38 so as to minimize blocking the light emitted from the light emitting layer 38 toward the bottom surface of the recess portion 16a. In the case where a light-reflecting member having larger area than the light emitting element 20 is disposed between the light emitting element 20 and the bottom surface of the recess portion 16a, the arrangement of the light emitting layer 38 and the first wavelength converting member 24 is desirably adjusted as the light-reflecting member being substantially the bottom surface of the recess portion.

The supporting member 32 and the first wavelength converting member 24 are preferably stacked in this order on the bottom surface of the recess portion 16a, so that the first wavelength converting member 24 can be spaced apart from the bottom surface of the recess portion 16a. Spacing the first wavelength converting member 24 apart from the bottom surface and the side surface of the recess portion 16a facilitates irradiation from the first wavelength converting member 24 on a wider area of the scattering surface. Also, the proportion of light scattered or reflected at the recess portion 16a returning the first wavelength converting member 24 can be reduced. Moreover, the portion between the side surfaces of the supporting member made of the supporting substrate 32 and the first wavelength converting member 24 and the recess portion 16a is preferably filled with a substantially light transmissive material. This is because with the presence of a member which substantially blocks transmission of light, uniform color mixing at the light scattering surface 18 may result, which causes color unevenness. Particularly, with the presence of a member which substantially blocks transmission of light only at a specific direction with respect to the center of the recess portion 16a, strong color unevenness appears. A member having a small light blocking area such as a wire for conducting electricity substantially does not block light and therefore does not pose a problem.

The respective members constituting the light emitting device 10 of the present embodiment will be described in detail below.

(Light Emitting Element 20)

It is sufficient that the light emitting element 20 has a light emitting layer made of a semiconductor. Particularly, an intense light emission in the short wavelength region of the visible light or in the near ultraviolet region can be obtained by a light emitting element having a light emitting layer made of a nitride semiconductor, especially a light emitting layer made of a gallium nitride-based compound semiconductor (particularly InGaN). Therefore, it can be advantageously used in combination with the wavelength converting member. The light emitting element 20 preferably has an emission spectrum having an emission peak wavelength of the light emitted from the light emitting layer 38 in a short wavelength range from the near ultraviolet to visible light of about 240 nm to 500 nm, preferably 380 nm to 420 nm, further preferably 450 to 470 nm. A light emitting element which emits light in this wavelength range is capable of emitting light of a desired color, particularly white light by combination with various wavelength converting member. The light emitting element 20 having a light emitting layer made of a ZnSe-based, InGaAs-based or AlInGaP-based semiconductor may also be used.

FIG. 2 is a schematic cross sectional view showing an example of the light emitting element 20. A semiconductor layer 36 of a first conductive type (for example, n-type), a light emitting layer 38, and a semiconductor layer 40 of a second conductive type (for example, p-type) are stacked in this order on a substrate 34 which is a light transmissive and electrically insulative, such as sapphire. The second conductive type semiconductor layer 40 and the light emitting layer 38 are partially removed to expose the first conductive type semiconductor layer 36, and a first electrode (n-side electrode) 42 is disposed on the exposed surface. Also, a second electrode (p-side ohmic electrode) 44 is disposed on the approximately entire surface of the semiconductor layer 40 of the second conductivity type, and a pad electrode (p-side pad electrode) 46 for connecting to the outside is further disposed on the second electrode 44. Each electrode may be either light transmissive or reflective, and generally, a light transmissive electrode is used in the case where mounting is carried out with the electrode forming surface being upper side and a reflective electrode is used in the case where the light emitting element 20 is mounted by flip-chip bonding with the electrode forming surface being downside as shown in FIG. 1.

As shown in FIG. 1, in the case of the present embodiment, the light emitting element 20 is mounted by flip-chip bonding on the first wavelength converting member 24 with the substrate 34 of the light emitting element 20 being the upper side. Electrodes for mounting are formed on the top surface of the first wavelength converting member 24 and are connected respectively with the first electrode 42 or the second electrode 46 of the light emitting element 20 through solder bumps and the like. The electrodes formed on the top surface of the first wavelength converting member 42 are further connected to the corresponding wirings 12a, 12b on the mounting substrate 12 through the respective wires. With this arrangement, the light emitting element 20 can be electrically operated from outside. A member capable of substantially blocking the light from the light emitting layer 38 is generally used for the electrode formed on the first wavelength converting member 24. For this reason, the electrode on the top surface of the first wavelength converting member 24 is provided only a part of the top surface of the first wavelength converting member 24 so that light travelling downwardly from the light emitting element 20 can reach the bottom surface of the recess portion 16a. It is preferable that the electrode portion projecting beyond the light emitting element 20 in top view has a width smaller than the width of the light emitting element 20.

The semiconductor light emitting element 20 that can be used in the present invention is not limited to one that has the structure shown in FIG. 2. For example, insulating, semi-insulating or reverse conductivity type structure may be provided in a part of the layer of each conductivity type. The substrate 34 may also be electrically conductive, in which case the first electrode 42 may be formed on the back surface of the substrate 34. The substrate 34 may be either the substrate used to grow the semiconductor layer or may be bonded after growing the semiconductor layer. Removing the substrate, the semiconductor layer alone can be used as a light emitting element. The shape of the light emitting element 20 in top view is typically a rectangle, and preferably a substantially square. With a substantially square shape as described above, the distances from the sides of the light emitting element 20 to the scattering surface can be set to be substantially equal, which facilitates reducing of color unevenness. It is preferable that the shape of the wavelength converting member 24 in top view is substantially the same as that of the light emitting element 20. The size of the light emitting element 20 with a side of about several hundred μm to several mm, more specifically, a substantially square element with a side of about 400 μm to 1 mm can be used. In this case, the distance from the side surface of the light emitting element 20 to the scattering surface 18 is, for example, about 0.5 to 2 mm.

(Wavelength Converting Member 30)

There is no limitation on the fluorescent material layer 30 as long as it is capable of absorbing a part of light emitted by the semiconductor light emitting element 20 and emitting light of a longer wavelength. The wavelength converting member 30 may be a member in which a wavelength converting member such as a fluorescent material is contained in a light transmissive member such as glass or resin, or may be a member made of a crystal of a wavelength converting member or an amorphous.

For the wavelength converting member, a near ultraviolet excited or a visible light excited fluorescent material is particularly preferable. Specifically, in the case where the light emitting element 20 is a blue light emitting element and a while light emitting device is desired to be made, a fluorescent material excited by blue light and then emits broad yellow luminescence is preferably used. Examples of such fluorescent material include a fluorescent material having garnet structure activated with cerium (particularly a fluorescent material having garnet structure that is activated with cerium and contains aluminum). A fluorescent material activated with cerium has broad emission spectrum in yellow region, and is therefore capable of producing white light of high color rendering performance when combined with blue light emission. A fluorescent material having garnet structure, particularly garnet structure containing aluminum, is durable against heat, light and moisture and can maintain the emission of yellow light with high brightness over a long period of time. As the wavelength converting material, for example, it is preferable to use a YAG fluorescent material (usually abbreviated to YAG) having composition of $(Re_{1-x}Sm_x)_3(Al_{1-y}Ga_y)_5O_{12}:Ce$ ($0 \leq x \leq 1$, $0 \leq y \leq 1$, where Re is at least one element selected from the group consisting of Y, Gd, La, Lu and Tb). Color rendering performance may also be adjusted by using a fluorescent material such as $Lu_3Al_5O_{12}:Ce$, $BaMgAl_{10}O_{17}:Eu$, $BaMgAl_{10}O_{17}:Eu, Mn$, $(Zn, Cd)Zn:Cu$, $(Sr, Ca)_{10}(PO_4)_6Cl_2:Eu, Mn$, $(Sr, Ca)_2Si_5N_8:Eu$, $CaAlSiB_xN_{3+x}:Eu$, and $CaAlSiN_3:Eu$, in addition to the yellow fluorescent material.

In the case where the emission wavelength of the light emitting element 20 is in the short wavelength region, the wavelength converting member 30 may contain two or more kinds of fluorescent materials. It may be such that a first wavelength converting material is excited by primary light emitted from the light emitting element 20 and then emits secondary light which excites a different kind of wavelength converting material to emit light. Use of two kinds of fluorescent materials having different chromaticity values makes it possible to emit light with any chromaticity within a region defined by connecting the chromaticity points of the two kinds of fluorescent materials and the semiconductor light emitting element on the chromaticity diagram.

For example, in addition to the above-described yellow light emitting fluorescent material, the wavelength converting member 30 may contain a fluorescent material capable of emitting light in a range from yellow to red. With this arrangement, the red component of the light can be increased and a light emitting device having a high general color rendering index Ra can also be obtained. The light emitting device having a high general color rendering index Ra is suited for illumination applications. Increasing the red component also enables to obtain the light emitting device that emits light of incandescent color. Examples of the fluorescent materials capable of converting light of near ultraviolet to visible light range to yellow to red range include a nitride fluorescent material, an oxynitride fluorescent material, and a silicate fluorescent material.

Examples of the nitride fluorescent material and oxynitride fluorescent material include Sr—Ca—Si—N:Eu, Ca—Si—N:Eu, Sr—Si—N:Eu, Sr—Ca—Si—O—N:Eu, Ca—Si—O—N:Eu, and Sr—Si—O—N:Eu. Of the nitride fluorescent material and the oxynitride fluorescent material, an alkaline earth-silicon nitride fluorescent material is preferable, which is represented by general formula: $LSi_2O_2N_2$:Eu, $L_xSi_yN_{(2/3x+4/3y)}$:Eu, $L_xSi_yO_zN_{(2/3x+4/3y-2/3z)}$:Eu (L represents one of Sr, Ca, or Sr and Ca).

Examples of the silicate fluorescent material preferably include $L_2SiO_4$:Eu (L represents an alkaline earth metal), $(Sr_xMae_{1-x})_2SiO_4$:Eu (Mae represents an alkaline earth metal such as Ca or Ba).

Meanwhile, for the light transmissive member for containing the wavelength converting material, an organic material or an inorganic material having light transmissive property for light of the light emitting element 20 can be used. As the organic material, a resin having light transmissive property is preferable. For example, it is preferable to use a silicone resin composition and a modified silicone resin composition. But it is possible to use insulating resin compositions having transparency, such as an epoxy resin composition, a modified epoxy resin composition and an acrylic resin composition. It is also possible to utilize resins having excellent weatherability, such as a hybrid resin containing at least one kind of these resins. It is also possible to use, as the inorganic material, amorphous materials such as glass, inorganic crystals and ceramics. As described above, in the case where a crystal of fluorescent material or an amorphous material which is itself a wavelength converting material, the need for the light transmissive member is eliminated.

With the use of a wavelength converting member made of a composite material of an inorganic binder made of an inorganic material and a fluorescent material, scattering of light within the wavelength converting member can be suppressed while improving the durability, and therefore is preferable. Various materials can be used for the inorganic binder, such as an inorganic crystal such as sapphire, an amorphous material such as glass, and ceramics. Generally, an organic material such as glass and sapphire has a small difference in the refractive index with respect to that of a fluorescent material made of an inorganic material. For example, the refractive index of the fluorescent materials having a garnet structure with aluminum is in a range from about 1.7 to 1.8, but the refractive index of common optically transmissive resins is about 1.5, while the refractive index of glass is about 1.6, and the refractive index of sapphire is about 1.7. Accordingly, scattering of light by the fluorescent material in the first wavelength converting member 24 is small, and thus the returning light to the light emitting element 20 can be suppressed. Also, an inorganic material has a hardness higher than that of an organic material such as a resin, and a high temperature processing is also possible. Thus, disposing a wiring on the first wavelength converting member 24 using an inorganic material can be performed easily, therefore preferable for the substrate surface on which a light emitting element 20 to be mounted. Any optically transmissive materials can be used for the inorganic binder, but it is desirable that the material has a difference in the refractive index with respect to the fluorescent material which is 0.3 or less, more preferably 0.2 or less, further preferably 0.1 or less.

In this case, it is preferable that the first wavelength converting member 24 a structure in which the fluorescent material and the inorganic binder are substantially uniformly mixed. For example, in the case where the structure of the first wavelength converting member has an island structure in which one of the fluorescent material and the inorganic binder is dispersed in an island shape in the other, uniform wavelength conversion can be performed in the first wavelength converting member, and therefore, preferable. In this case, the structure may either be such that the fluorescent material is dispersed in an island shape in the inorganic binder or that the inorganic binder is dispersed in the fluorescent material in an island shape. For uniform wavelength conversion, the diameter of the islands in the sea-island structure may be set, for example, in a range from 1 μm to 50 μm.

The wavelength converting member 30 of the present embodiment, the first wavelength converting member 24 is formed below the light emitting element 20 and the second wavelength converting member 26 is formed over the light emitting element 20. The first wavelength converting member 24 and the second wavelength converting member 26 are used for different purposes in the light emitting device 10, thus leading to different preferred structures.

1: First Wavelength Converting Member 24

The first wavelength converting member 24 formed in contact with the bottom surface of the light emitting element 20 serves for converting wavelength of light mainly emitted from the bottom surface of the light emitting element 20, as well as serves as a substrate for fixing the light emitting element 20 and as a heat releasing path from the light emitting element 20 to the mounting substrate 12. In the present embodiment, the light emitted from the side surfaces and the bottom surface of the light emitting element 20 and the light emitted from the first wavelength converting member 24 are scattered at the scattering surface formed in the recess portion 16a and mixed, then emitted to the outside. As described above, scattering of light in the first wavelength converting member 24 is not required, so that a composite material made of an inorganic binder made of an inorganic material and a fluorescent material is preferably used for the first wavelength converting member 24. With this arrangement, the return light from the first wavelength converting member 24 to the light emitting element 20 can be prevented. Strict control of the size and arrangement in view of color unevenness is not necessary to the first wavelength converting member 24 and the shapes and arrangements can be relatively freely assigned as long as the wavelength conversion of the light of the light emitting element 20 can be performed.

For example, the first wavelength converting member 24 preferably has a plate shape. In the case where the first wavelength converting member 24 has a plate-shape, a part of the light in the wavelength converting member 30 undergoes total internal reflection at the opposing two principal surfaces, and is emitted from the side surfaces. Thus, light emitted from the side surface has a longer optical path in the wavelength converting member, so that the intensity of the light whose wavelength is converted tends to be increased, and the color unevenness is theoretically likely to occur. However, in the present embodiment, the side surfaces of the light emitting element 20 are exposed and accordingly, the emission of the light emitting element 20 in the same direction as the emission from the end surfaces of the first wavelength converting member 24 is also enhanced. The light emitted from the light emitting element 20 and the first wavelength converting member 24 as described above is scattered at the recess portion 16a, so that occurrence of color unevenness can be suppressed even with the first wavelength converting member 24 having a plate shape. In this case, the first wavelength converting member 24 is preferably disposed in parallel to the light emitting element 20. With the first wavelength converting member 24 having a plate shape, the light emitting element 20 can be stably fixed. Also, forming the first wavelength converting member 24 in a plate-shape facilitates the assembly of the light emitting device 10, because the first wavelength converting member can be processed as a plate-shape material with a slightly larger size and then cut it off with a desired size to fix it on the supporting substrate 32. The first wavelength converting member 24 of the present embodiment also serves as a mounting surface for flip-chip mounting the light emitting element 20, and further with the first wavelength converting member 24 having a plate shape, disposing of the wiring can also be facilitated. For example, a wiring pattern is formed on the first wavelength converting member 24 which is processed in an oversized planar shape, and then cut it out to bond on the support member 32. Connecting the wiring pattern on the surface of the first wavelength converting member 24 and the light emitting element 20 by a conductive member such as a metal and a resin or by an adhesive enables releasing heat from the light emitting element 20 to the first wavelength converting member 24 through the wiring pattern. Flip-chip mounting of the light emitting element 20 allows the light emitting layer 38 which is a cause of generating heat to be close to the first wavelength converting member 24, so that heat can be released efficiently.

Moreover, a light transmissive material may be arranged on the top surface of the first wavelength converting member having a plate shape as described above to dispose a light emitting element on the light transmissive member. For example, as shown in FIG. 1, the first wavelength converting member 24 is disposed in contact with the bottom surface of the light emitting element 20, but the first wavelength converting member 24 may be disposed through a different light transmissive member. In order that the first wavelength converting member 24 has a "sheet shape", the overall shape may be a sheet shape, and that may define a recess or a hole for mounting a light emitting element. A pattern for generating an optical effect may be formed on the surface. In the case where the first wavelength converting member 24 has a "plate shape", the planar shape thereof is not limited to a square and may have various shapes such as a circle or oval in a plan view. The indication of the "plate shape" is applied in the same manner in other embodiments.

The first wavelength converting member 24 is preferably made of an inorganic material. The supporting member 32 is preferably made of a material having a heat conductivity of 0.8 (W/mK) or more, preferably 1.2 (W/mK) or more, and more preferably 35 (W/mK) or more. More specifically, the first wavelength converting member 24 may be made of a crystal of an inorganic-based fluorescent material or an amorphous material itself, or the first wavelength converting member 24 may be made by containing inorganic-based fluorescent material particles in a transparent member made of an inorganic material. Examples of the first wavelength converting member 24 made of a crystal of an inorganic-based fluorescent material or an amorphous material itself includes YAG, $(Sr, Ba)_2SiO_4$:Eu. In the case where inorganic fluorescent material particles are contained in a transparent member formed from an inorganic material, an amorphous material such as glass, inorganic crystal or ceramics may be used as the transparent member of the inorganic material. For example, a sintered compact of fluorescent material particles and transparent material particles, or a sintered compact of fluorescent material particles and glass may be used. A polycrystalline body of fluorescent material particles and other member may be used also. Forming the first wavelength converting member 24 with such material enables to improve the durability of the first wavelength converting member 24 and at the same time improve the heat dissipation from the light emitting element 20 to the mounting substrate 12, and therefore, the light emitting device 10 with high reliability can be realized. Also, the first wavelength converting member 24 made of an inorganic material has hardness higher than that made of an organic material such as a resin, and also a high temperature processing is possible, so that disposing a wiring on it can be performed easily, and therefore preferable for the substrate surface on which a light emitting element 20 to be mounted.

The shape of the first wavelength converting member 24 in top view is preferably substantially a square, as is the light emitting element 20. The first wavelength converting member 24 overlaps the light emitting element 20 in top view and preferably has a larger size than the light emitting element 20. Specifically, the length of a side of the first wavelength converting member 24 may be about 1.5 to 3.5 times of the length of a side of the light emitting element 20. For example, in the case where the light emitting element 20 is substantially a square with a side of about 450 μm, the first wavelength converting member 24 may be substantially a square with a side of about 1 mm, and in the case where the light emitting element 20 is substantially a square with a side of about 1.5 mm, the first wavelength converting member may be substantially a square with a side of about 1.5 mm. With this arrangement, the distance from the side surface of the first wavelength converting member 24 to the scattering surface may be about 0.5 to 1.5 mm. A thickness which enables to obtain a desired chromaticity can be employed for the thickness of the first wavelength converting member 24, and which is for example about 100 μm to 200 μm.

2: Second Wavelength Converting Member 26

The second wavelength converting member 26 disposed on the top surface of the light emitting element 20 serves to convert the wavelength of light which is mainly the light emitted from the light emitting element 20 and extracted outside without being incident on the recess portion 16a of the package. Such light is not subjected to color mixing by scattering, therefore, the second wavelength converting member 26 is preferably formed so as to obtain an approximately uniform optical path length through which light emitted from the light emitting element 20 propagates. With this arrangement, a light emitting device with less color unevenness can be obtained. The second wavelength converting member 26 preferably covers the top surface and the side surfaces of the light emitting element 20 with a substantially uniform thickness. The second wavelength converting member 26 preferably has a plate shape as that of the first wavelength converting member 24.

The wavelength converting member 30 of the present embodiment includes the first wavelength converting member 24 connected to the bottom surface of the light emitting element 20, and the second wavelength converting member 26 being in contact with the top surface of the light emitting element 20. The second wavelength converting member 26 is preferably such that the outer size in planar direction is larger than that of the light emitting element 20 and protruding in a flange shape from the top edge of the light emitting element 20. This arrangement allows the light emitted from the top surface of the light emitting element 20 propagates through the wavelength converting member 26 before it is extracted to the outside. For example, in the case where the size of the second wavelength converting member 26 is substantially the same as that of the light emitting element 20, there may be a case where the light obliquely emitted from the side surfaces of the light emitting layer 38 propagates outside of the second wavelength converting member 26 and is not incident on the light scattering surface at the surface defining the recess portion 16a and then directly extracted to outside of the recess portion 16a. Therefore, as shown in FIG. 1, the second wavelength converting member 26 is formed larger than the light emitting element 20 so that it protrudes in a flange shape from the outer periphery of the light emitting element 20. This arrangement allows all the light emitted from the light emitting layer 38 of the light emitting element 20 which is not scattered at the recess portion 16a to reach the light scattering surface of the recess portion 16a and is scattered, or to propagate through the second wavelength converting member 26. The size and the planar shape of the second wavelength converting member 26 is not specifically limited as long as the flange portion of the second wavelength converting member 26 projects from the outer periphery of the light emitting element 20 to a degree that enables the above. But, if the size of the second wavelength converting member 26 is too large, the light scattered at the recess portion 16a will propagate through the second wavelength converting member 26 again, which may cause occurrence of color unevenness, reduction in light emission output, or the like. In the present embodiment, the maximum size of the second wavelength converting member 26 in planar direction is 1.1 times or greater, preferably 1.5 times or greater, and three times or less, more preferably 2 times or less than the maximum size of the light emitting layer 38 of the light emitting element 20 in planar direction.

Either an inorganic material or an organic material can be used for the second wavelength converting member 26. As in the first wavelength converting member 24, the second wavelength converting member 26 may be made of a crystal of an inorganic-based fluorescent material or an amorphous material itself, or the first wavelength converting member 24 may be made by containing inorganic-based fluorescent material particles in a transparent member made of an inorganic material, and with this arrangement, the durability of the second wavelength converting member 26 itself can be increased and also the mechanical strength of the second wavelength converting member 26 can be enhanced. Also, as described above, it facilitates forming the second wavelength converting member 26 in a plate shape which projects from the outer periphery of the light emitting element 20 in a flange shape. Forming the first wavelength converting member 24 and the second wavelength converting member 26 with the same material enables reduction in the manufacturing cost by communalizing the members, which also allows the stress induced by the difference in the thermal expansion coefficient and applied to the top and the bottom surfaces of the light emitting element 20 to be uniform, thus contributing to the improvement of the reliability of the light emitting device 10.

Meanwhile, the second wavelength converting member 26 may be made with a structure in which fluorescent material particles are dispersed in a light transmissive resin. The second wavelength converting member 26 disposed on the top surface of the light emitting element 20 serves to convert the wavelength of light which is mainly the light emitted from the light emitting element 20 and extracted outside without being incident on the recess portion 16a of the package. Such light is not subjected to color mixing due to the light scattering surface 18, and therefore, the light is preferably scattered within the second wavelength converting member 26. It is preferable that forming the second wavelength converting member 26 with a structure in which a fluorescent material is dispersed in a light transmissive resin enhances the scattering within the second wavelength converting member 26. Specifically, a fluorescent material made of an inorganic material such as a garnet fluorescent material is dispersed in a light transmissive resin having a difference in the refractive index with that of the fluorescent material being 0.3 or greater, more preferably 0.4 or greater. A silicone resin composition, a modified silicone resin composition, or the like is preferably used as the light transmissive resin, but a light transmissive insulating resin composition such as an epoxy resin composition, a modified epoxy resin composition, or an acrylic resin composition can also be used. It is also possible to use resins having excellent weatherability, such as a hybrid resin containing at least one kind of these resins.

A pattern to obtain an optical effect such as a lens pattern may be disposed on the light receiving surface and the light emitting surface of the first wavelength converting member 24 and the second wavelength converting member 26 respectively. As described above, the first wavelength converting member 24 of the present embodiment has a plate-shape, but a pattern may be disposed on the surface as long as the overall shape remains a plate-shape. Also, even in a case where a pattern is provided on the fixing surface of the light emitting element, the light emitting element can be fixed stably if the period of the pattern is sufficiently smaller than the size of the light emitting element.

(Package 16, Recess Portion 16a)

The package 16 may have any structure as long as it defines a recess portion 16a with a part of the inner surface being a light scattering surface, and is capable of housing the light emitting element 20 and the wavelength converting member 30 so that an electric connection to the light emitting element 20 can be made. In the present embodiment, the package 16 is constructed of a mounting substrate 12 which is a plate shape insulating member having wirings 12a, 12b disposed thereon, and an circular inner side wall 14 formed on the mounting substrate 12. In top view, the package 16 has a rectangular external shape and a circular cut is performed to form a circular inner side wall 14. The recess portion 16a is defined by the top surface and the inner surface of the side wall 14 of the mounting substrate 12. In the present embodiment, the side surface of the recess portion 16a is formed as the light scattering surface 18 by dispersing light transmissive particles 17 in the mother material which forms the side wall 14. Further, in the present embodiment, the side surface of the recess portion 16a is made as the light scattering surface, but the light scattering surface can be formed also on the bottom surface of the recess portion 16a. For example, an appropriate scattering layer may be formed on the mounting substrate 12, except a region for wiring. Moreover, the present embodiment employs a structure with which the emission from the semiconductor element 20 is simply scattered at the light scattering surface 18 without any optical effects (such as absorption or wavelength conversion) other than scattering. With such arrangements, optical loss at the light scattering surface 18 can be prevented and the light extraction efficiency can be enhanced.

The recess portion 16a can be defined in any shape as long as the light emitting element 20 and the wavelength converting member 30 can be housed therein, and is opens upwardly so that light can be extracted therefrom. But, the bottom surface of the recess portion 16a is preferably flat so that the light emitting element 20 and the like are stably fixed. Further, it is preferable that the inner diameter of the recess portion 16a increases from the bottom upward. Also, the inner wall defining the recess portion 16a preferably has a circular cross section in plan view, so that uniformity of emission can be enhanced and the color unevenness can be suppressed. The light emitting element 20 typically has a rectangular shape in plan view, and color unevenness is easily generated even if the entire surface of the light emitting element 20 is covered with the wavelength converting member. Therefore, light from the light emitting element 20 having a rectangular shape in plan view is scattered at the light scattering surface in the recess portion 16a defined by a circular shape in plan view, and accordingly, the uniformity of emission can be enhanced and color unevenness can be suppressed. In addition, with a rectangular shape in plan view, manufacturing of the wavelength converting member 30 having a plate shape can be facilitated, and light from a light source having such a rectangular shape is preferably scattered at a light scattering surface in a recess portion 16a defined by a circular shape in plan view. An example is shown in FIG. 7. FIG. 7 is a schematic top view showing an example of light emitting device according to the present embodiment. Particularly, in the case where the light source inclusive of the light emitting element 20 and the wavelength converting member 30 has a rectangular shape in plan view, an intensity difference occurs between the light emitted from the sides of the rectangular shape and the light emitted from the corners of the rectangular shape, but by scattering such emissions at the circular inner contour of the recess portion 16a, the color unevenness due to the shape of the light source can be suppressed. Further, the shape defining the recess portion 16a is preferably a mortar shape with a circular cross-sectional shape in plan view at any height. The light source which includes the light emitting element 20 and the wavelength converting member 30 is preferably disposed at the center of the recess portion 16a in plan view. Also, as shown in FIG. 7, in order to efficiently extract light emitted on the light scattering surface, in top view, it is preferable that the light scattering surface 18 formed on the side surface of the recess portion 16a is arranged at a location outer side than the light emitting element 20 and the wavelength converting member 30 so that the light scattering surface 18 can be observed.

The light scattering surface 18 formed on the inner surface defining the recess portion 16a is capable of scattering the light emission of the light emitting element 20 and the light emission of the wavelength converting member 30. The surface capable of scattering light may be obtained by distributing a material having a minute structure with a size approximately the same or smaller than the emission wavelength of either the light emitting element 20 or the wavelength converting member 30, which is shorter wavelength, and having a refractive index different from its surrounding.

For example, as in the side wall 14 of the present embodiment, the light scattering surface 18 can be formed by dispersing light transmissive particles having a refractive index different from that of the mother material in the light transmissive mother material. The difference in the refractive index between the particles and the surrounding materials is preferably 0.1 or greater, more preferably 1.0 or greater. In this specification, the refractive index is a refractive index in air. As for the particles, inorganic-based particles such as glass fiber, glass beads, talk, silica, alumina, magnesia, zinc oxide, calcium carbonate, barium sulfate, titania, aluminum hydroxide, mica, feldspar powder, quartz powder, or the like, organic-based particles such as silicone resin, fluororesin, epoxy resin, styrene-based cross-linked resin, or the like, can be used as single or in combination of two or more. For the particles 17, an oxide containing one of Ti, Zr, Nb, Al and Si, and AlN, MgF, and the like, are preferable ($TiO_2$, $ZrO_2$, $Nb_2O_5$, and $Al_2O_3$ are preferable as the oxide containing Ti. Zr, Nb, Al or Si). Among those, an oxide containing one of Ti, Zr, Nb, and Al, particularly, $TiO_2$ is preferable. The particles 17 made of a material described above have a large refractive index and the refractive index with respect to the sealing member can be increased, so that a stronger scattering can be obtained and thus preferable. In any of those oxides described above do not present absorption in the visible light range, and do not contribute to the decrease in the efficiency and thus preferable. The particles 17 are preferably contained to a degree that can be observed as white, so that the light scattering surface 18 can be made with a low light transmissiveness and a high reflectivity, and thus the efficiency of light extraction at the opening of the recess portion 16a can be improved.

For obtaining efficient light scattering, it is preferable that the average particle size R of the particles satisfies the inequation $0.4 \times \lambda/\pi < R < \lambda$, with the emission wavelength of the light emitting element 20 as $\lambda$. The scattering is in Rayleigh scattering region with the average particle size of $0.4 \times \lambda$/or smaller and the scattering intensity increases proportional to the fourth power of the wavelength. Therefore, the scattering of the light emitted from the fluorescent material which has a longer wavelength becomes weak. Thus, it is preferable that the average particle size R of the particles is 70 nm or greater, more preferably 200 nm or greater, and 400 nm or smaller, more preferably 300 nm or smaller.

Also, the scattering coefficient of the light scattering surface can be adjusted by the amount of the particles contained. For example, the amount of the particle can be 10 to 50 weight percent of the whole light scattering surface, and particularly, in the case where $TiO_2$ particles are contained, 20 to 40 weight percent of the whole is desirable. It is preferable that with the particles contained in an amount of 30 weight percent or greater, the scattering is enhanced while increasing the reflectivity at the light scattering surface 18.

The mother material which contains the particles 17 is preferably made of a silicone resin, an epoxy resin, glass, or the like. Among those, a silicone resin has thermosetting, light resistant, and relatively flexible properties. Silicone resin has a low refractive index of about 1.4, so that a sufficient difference in refractive index with respect to the particles such as $TiO_2$ (refractive index of about 2.5) can be easily obtained and therefore the scattering at the light scattering surface 18 can be enhanced, and is thus preferable.

The light scattering surface 18 on the surface defining the recess portion 16a may be formed by using a different method. For example, the inner surface of the side wall 14 can be made as a light scattering surface by forming the side wall 14 by using a porous body formed by aggregation and sintering of particles. The side wall 14 may be formed by using a porous body obtained by using a sol-gel method. At such a porous body, light scattering occurs due to the difference in the refractive index between the material of the porous body and the air (or a material having a different refractive index filled in the holes) at the holes of the porous body. In the case where such a porous body is used for the side wall 14, a composite material of a porous body and a resin may be used to increase the sealing property and the airtightness. The light scattering surface can also be obtained by performing a treatment for forming unevenness or roughness, or disposing a layer of light scattering particles on the surface of the light transmissive member or the reflective member.

Although it is also preferable in the present embodiment that the light scattering surface 18 formed on the surface defining the recess portion 16a is formed as wide region as possible, the light scattering surface 18 is to be formed at least a portion of the side surface of the recess portion 16a, more preferably to be formed on the entire portion of the side surface thereof. With such arrangements, color unevenness can be suppressed efficiently. That is, color unevenness may occur due to a difference in the length of optical paths of the light emitted from the light emitting element 20 propagating through the wavelength converting member 30. But the light emitted from the light emitting element 20 toward the bottom surface of the recess portion 16a is directly incident on the wavelength converting member 30, and accordingly, the lengths of the optical paths in the wavelength converting member 30 are relatively uniform, and thus color unevenness is unlikely to occur. On the contrary, the light obliquely propagating from the light emitting element 20 toward the side surface of the recess portion 16a obliquely propagates in the wavelength converting member 30 before emitted, so that color unevenness due to the difference in the length of the optical paths of the wavelength converting member 30 tends to occur. In the case where the light scattering surface 18 is provided on the side surface of the recess portion 16a, the light scattering surface 18 is preferably formed so as to uniformly enclose the light emitting element 20. That is, in plan view, the light scattering surface 18 is preferably formed uniformly in all the directions around the center of the light emitting element 20. This is because, in the case where the light scattering surface 18 is formed widely only in one direction or is formed only in one direction around the center of the light emitting element 20, color unevenness may occur.

Particularly, as in the present embodiment, in the case where a plate shape wavelength converting member (the first wavelength converting member 24, the second wavelength converting member 26) is employed, the light emission tends to be stronger at the side surfaces of the plate shape body, which tends to results in color unevenness. However, with the plate shape body (first wavelength converting member 24) disposed substantially in parallel with the bottom surface of the recess 16a, the light emitted from the side surfaces of the plate shape body is most likely incident to the regions in the side surface of the recess portion 16a which are facing the side surfaces of the plate shape body. Therefore, the light scattering surface is preferably formed on the side surface of the recess portion 16a, specifically on the regions facing the side surfaces of the light emitting layer 38. With this arrangement, the color unevenness which is due to the plate shape of the first wavelength converting member 24 can also be efficiently suppressed. In order to suppress the return light to the light emitting element 20, the light scattering surface preferably has a surface capable of emitting light emitted from the light emitting element 20 in a direction approximately parallel to the principal surface of the light emitting element 20 or in a direction closer to the opening of the recess portion 16a than the approximately parallel direction.

In the specification, the term "bottom surface" of the recess portion 16a means among the regions defining the recess portion 16a, a region including the projected area of the light emitting element 20 in the optical axis direction and locating at the same height or lower than the projected area, and the term "side surface" of the recess portion 16a means the regions rising above the "bottom surface". The descriptions of "bottom surface" and "side surface" will be applied in the same manner to the recess portions 16a in other embodiments.

(Supporting Substrate 32)

In the case of the present embodiment, the light emitting element 20 is bonded to the mounting substrate 12 through the first wavelength converting member 24 and the supporting substrate 32 so that the light emitting layer 38 of the light emitting element 20 is spaced apart at a predetermined distance from the bottom surface of the recess portion 16a of the package. The supporting member 32 of the present embodiment is light transmissive to the light emission of the light emitting layer 38 so that the light emitted downwardly from the light emitting layer 38 can be used efficiently. Further, the supporting substrate 32 forms, with the first wavelength converting member 24, a heat dissipation path from the light emitting element 20 to the mounting substrate 12, so that the supporting member 32 is preferably made of a material having high heat conductivity. The supporting member 32 is preferably made of a material having a heat conductivity of 0.8 (W/mK) or more, preferably 1.2 (W/mK) or more, and more preferably 35 (W/mK) or more.

For example, an inorganic material such as sapphire or glass can be used for the supporting substrate 32. Among those, sapphire is preferable because it has a relatively high heat conductivity and a high transmissivity to the blue light emitted from the light emitting element 20.

(Mounting Substrate 12)

The mounting substrate 12 is sufficient to have a wiring formed on its surface for electrical connection with the semiconductor light emitting element 20. In the case of the present embodiment, the mounting substrate 12 is formed with a flat plate shape insulating member and a wiring disposed on the insulating member. Ceramic such as aluminum nitride or alumina, or glass can be used as the insulating member. Otherwise, the mounting substrate 12 may be such that an insulating thin film layer such as aluminum nitride is formed on a surface of a semi-metal such as Si or a metal. Those mounting substrates 12 are preferable because of their high heat dissipation. The wiring may be formed by subjecting a metal layer to patterning using an ion milling method or an etching method. For example, the wiring pattern made of a thin film of platinum or the like may be formed on the surface of aluminum nitride. Further, a protective film made of a thin film such as $SiO_2$ may be formed for the purpose of protecting the wiring pattern. In addition, a heat dissipating body such as a metal member which is insulated from the wiring of the mounting substrate may be disposed on the region where the supporting member to be disposed.

(Sealing Member 28)

The material of the sealing member 28 filled in the recess portion 16a is not specifically limited as long as it has a light transmissive property. A silicone resin composition, a modified silicone resin composition, or the like is preferably used in view of durability, but a light transmissive insulating resin composition such as an epoxy resin composition, a modified epoxy resin composition, or an acrylic resin composition can also be used. A sealing member having excellent weather resistance such as a hybrid resin containing at least one kind of these resins can also be used. Further, an inorganic material having excellent light resistance such as glass or silica gel can also be used. The sealing member 28 is preferably a member having a light transmissivity of the light from the light emitting element 20 and the wavelength converting member 30 higher than that of the wavelength converting member 30, and having a content of a fluorescent material smaller than that of the wavelength converting member 30, and is further preferably a light transmissive member that does not contain a fluorescent material. In addition, a light scattering agent that is capable of scattering light is preferably not contained. The top surface of the sealing member 28 is preferably approximately flat and also approximately in parallel with the first wavelength converting member 24. With this arrangement, light obliquely emitted from the principal surface and side surfaces of the first wavelength converting member 24 having a plate-shape can easily enter the sealing member 28 at a high angle, so that the light can be facilitated to return to the recess portion 16a to be scattered. Also, lens effect can be obtained by forming the light emitting surface side of the sealing member 28 in a predetermined shape. The size of the lens can be selected from either a smaller size or a larger size than the area of the opening in the top plane of the recess portion 16a, and also, a grove can be provided on the surface of the lens to control the distribution of the light. Further, the total internal reflection at the sealing member can be reduced and the light extraction efficiency can be increased by forming the sealing member in a shape which is protruding from the recess portion 16a so that the top surface of the sealing member has an outwardly curving surface.

Figure 8:
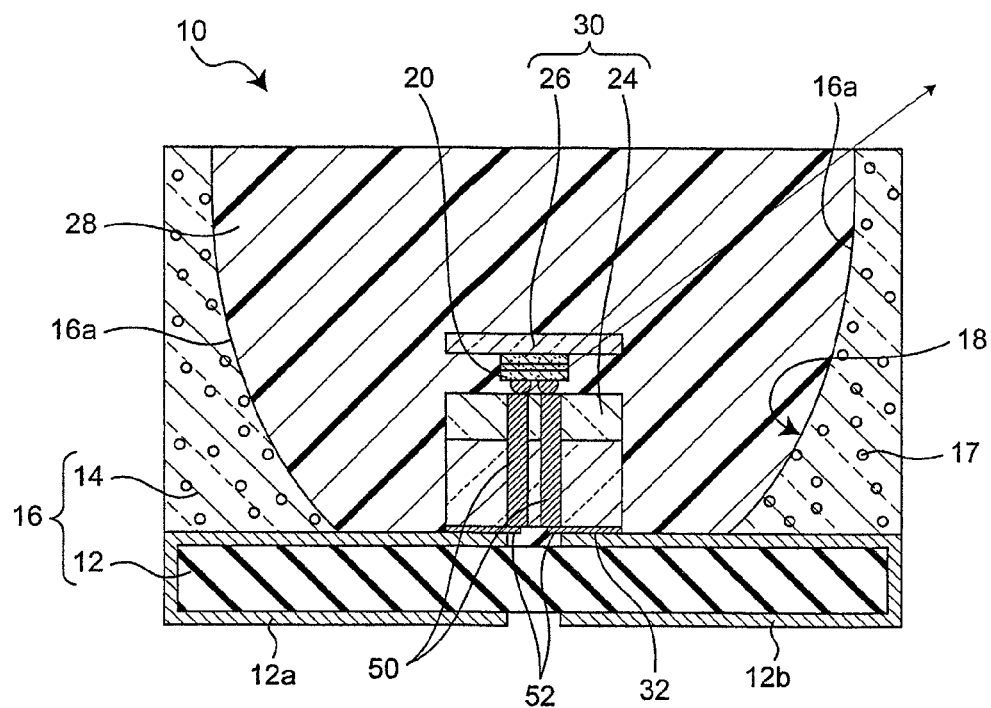
FIG. 8 is a schematic sectional view showing a light emitting device according to the first embodiment of the present invention.

FIG. 8 is a schematic cross-sectional view showing a light emitting device according to the third embodiment of the present invention. Via holes are provided each passing through the first wavelength converting member 24 and the supporting member 32, and through the conductive material 50 filled in the via holes, electric connection is established with the respective wirings 12a, 12b of the mounting substrate. This embodiment is similar to the first embodiment in other respects.

Via holes are provided each passing through the first wavelength converting member 24 and the supporting member 32, and through the conductive material 50 filled in the via holes, electric connection is established with the respective wirings 12a, 12b of the mounting substrate. The conductive material 50 and the respective wirings 12a, 12b of the mounting substrate may be bonded by using an appropriate material such as a solder, a metal eutectic, or the like. Further improvement in the heat dissipation of the light emitting element 20 can be obtained by directly connecting the light emitting element 20 and the respective wirings 12a, 12b through the conductive material 50, as in the present embodiment. For the conductive material 50, a material having high heat conductivity and electric conductivity is preferable and, for example, Cu, Ag, Au, Ni, or the like can be used. Further, filling such conductive material 50 in the via holes allows the conductive material 50 to be used as a reflecting portion. With this arrangement, light in the first wavelength converting member 24 and the supporting substrate 32 can be reflected and extracted toward the light scattering surface 18.

Moreover, as in the present embodiment, in the case where a light blocking member such as a metal member which is capable of substantially blocking light is disposed in the supporting member, such light blocking member is preferably disposed at a position overlapping the light emitting element 20 in top view. This is because disposing a light blocking member such as a metal member at a position outside of the light emitting element 20 may result in blocking light of specific direction with respect to the light emitting element 20, which may cause occurrence of strong color unevenness. Generally, in a light emitting element 20 mounted by flip-chip manner as shown in FIG. 8, a reflection electrode is disposed at the mounting surface side, so that small amount of light is to be extracted from the bottom of the light emitting element 20. Therefore, even the light blocking member is disposed under the light emitting element 20, the light emission from the light emitting element 20 may hardly blocked.

Figure 9:
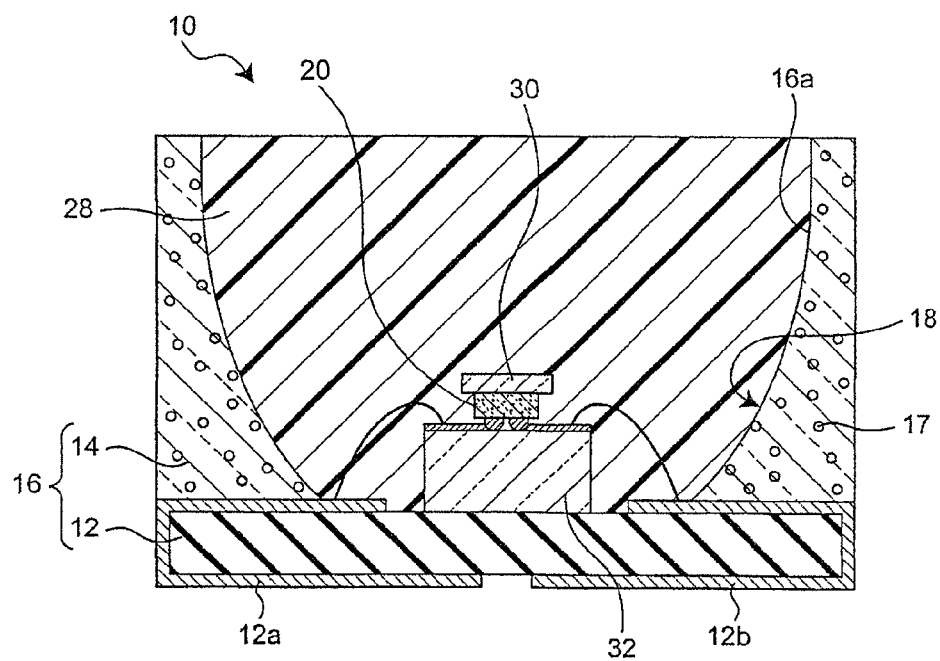
FIG. 9 is a schematic sectional view showing a light emitting device according to the first embodiment of the present invention.

FIG. 9 is a schematic cross-sectional view showing a light emitting device according to the third embodiment of the present invention. In the present embodiment, a single wavelength converting member 30 is disposed only at the upper side of the light emitting element, that is, the wavelength converting member 30 is only disposed between the light emitting element 20 and the opening at the top plane of the recess portion. This embodiment is similar to the first embodiment in other respects.

In the case of the present embodiment, only a single wavelength converting member 30 is used, accordingly, the light emitting device 10 can be realized with a simpler structure and thus enables manufacturing at a lower cost. The wavelength converting member 30 is only provided at the upper side of the light emitting element, so that the heat dissipating capabilities of the heat conducting path from the light emitting element 20 to the mounting substrate 12 can be enhanced, and thus, the light emitting element 20 with a high heat dissipation efficiency can be obtained, and further, deterioration of the wavelength converting member 30 due to the heat generated from the light emitting element 2 can be prevented. Further, in the case of the present embodiment, the bottom surface and the side surfaces of the light emitting element 20 are not covered with the wavelength converting member 30, which enables to decrease the probability of light returning into the light emitting element 20 due to the scattering by the fluorescent material particles contained in the wavelength converting member 30, and therefore, the light emission output can also be improved. As described above, with increasing the amount of light directly extracted from the light emitting element 20, providing the light scattering surface and mixing the colors of light emitted from the light emitting element 20 and the wavelength converted light which propagated through the wavelength converting member 30, and then extracting the light from the opening of the recess portion 16a, the color unevenness can be suppressed and the light emission output can be improved. Also, the light emitting element 20 and the wavelength converting member 30 are provided spaced apart from the bottom surface of the recess portion 16a, so that light downwardly propagating from the light emitting element 20 can be prevented from returning into the light emitting element. Meanwhile, in order to prevent color unevenness from occurring, the size and arrangement of each member are preferably determined so that light downwardly propagating from the light emitting element 20 is reflected at the bottom surface of the recess portion 16a and then scattered at the light scattering surface 18 on the side surface of the recess portion 16a, or propagates through the wavelength converting member 30. Also, the bottom surface of the recess portion 16a may be made as a light scattering surface by using a method, such as, covering the bottom surface of the recess portion 16a with the same resin used for the side wall 14. With the bottom surface of the recess portion 16a being a light scattering surface, the light propagating downwardly from the light emitting element 20 is also scattered when it is reflected at the bottom surface of the recess portion 16a, and is subjected to color mixing with the light propagates through the wavelength converting member 30, and then extracted from the opening of the recess portion 16a.

In the case where a single wavelength converting member 30 is used, the wavelength converting member 30 is preferably disposed upper side of the light emitting element 20. This arrangement allows all the emission from the light emitting layer 38 of the light emitting element 20 which is not scattered at the recess portion 16a to propagate through the second wavelength converting member 16a. For this, as described in the first embodiment, the second wavelength converting member 26 is preferably such that the outer size in planar direction is larger than that of the light emitting element 20 and projecting in a flange shape from the outer periphery of the light emitting element 20. The wavelength converting member 30 in the case of the present embodiment is preferably made of an inorganic material as in the second wavelength converting member 26 of the first embodiment.

Figure 10:
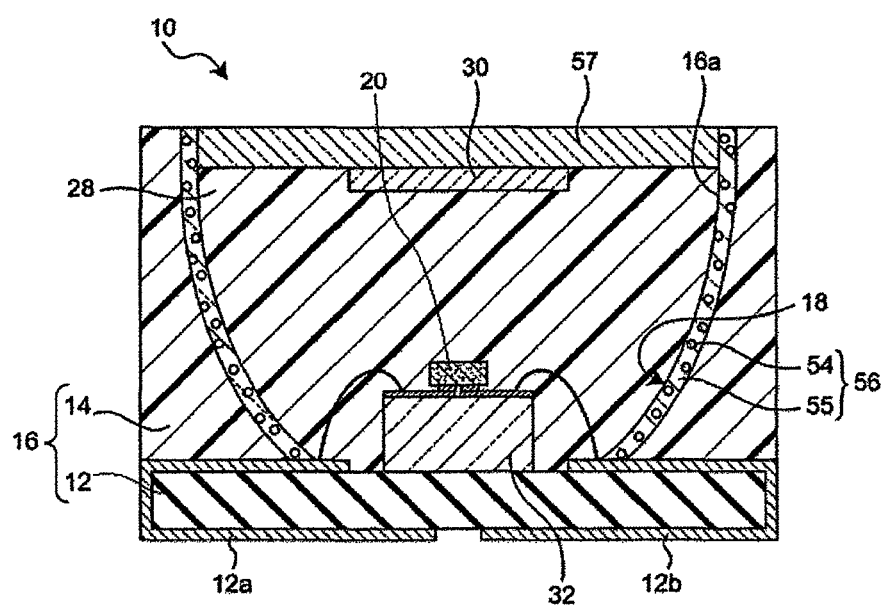
FIG. 10 is a schematic sectional view showing a light emitting device according to the fourth embodiment of the present invention.
Figure 11:
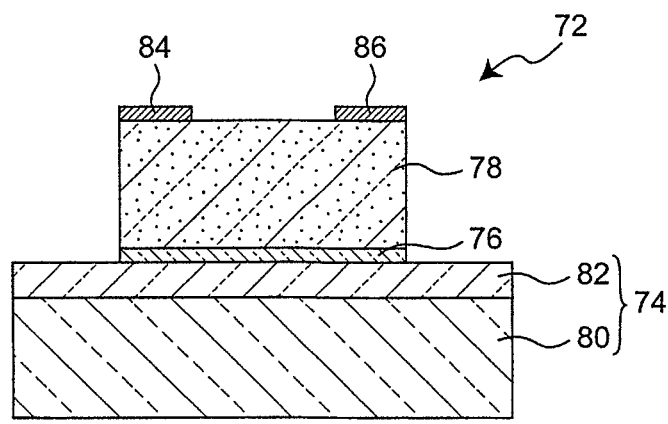
FIGS. 11(a) and 11(b) are schematic cross-sectional views showing a conventional light emitting device.
Figure 11:
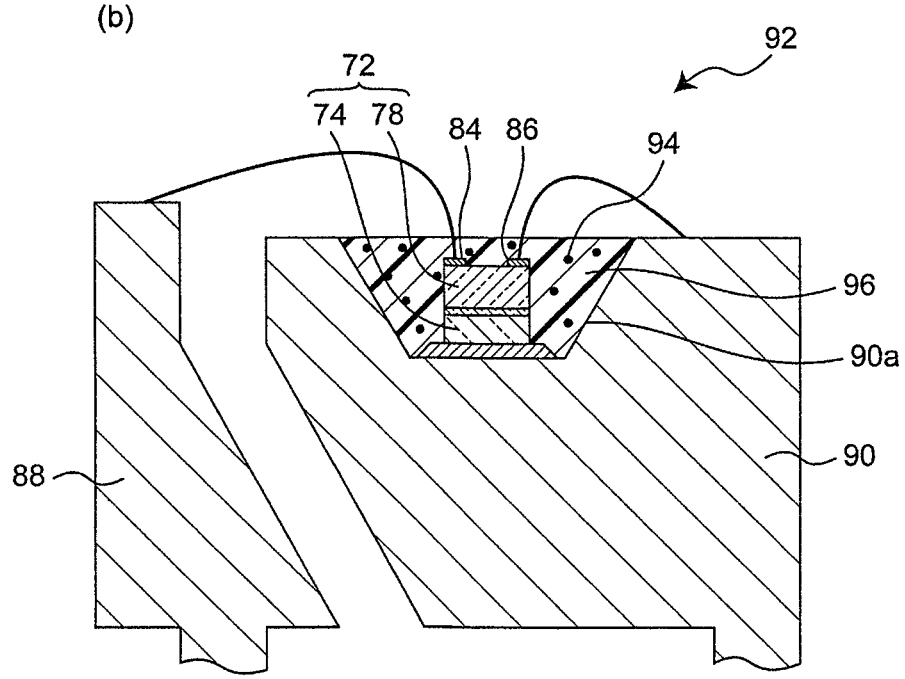

FIG. 10 is a schematic cross-sectional view showing a light emitting device according to the fourth embodiment of the present invention. In the case of the present embodiment, in the light emitting device 10, the top plane of the recess portion 16a is covered with a light transmissive member 57, and a wavelength converting member 30 capable of absorbing a part of the light emission of the light emitting element 20 and emitting light with a wavelength different than that of absorbed light is fixed at the light emitting element side of the light transmitting member 57. Also, a fluorescent material layer 56 with fluorescent particles 54 dispersed therein is formed on the side surface of the recess portion 16a, where, the fluorescent material particles 54 serve to perform scattering of light emitted from the light emitting element 20 and at the same time also serve to perform wavelength conversion of the light. More specifically, the fluorescent material layer 56, in which the fluorescent material particles 54 are dispersed in the fluorescent material retaining member 55, is formed on the inner surface of the side wall 14 of the package. The side wall 14 of the package is made of a material capable of providing high reflectivity at the emission wavelength of the light emitting element 20 at the interface with the fluorescent material layer 56.

The wavelength of a part of the light emitted from the top surface of the light emitting element 20 is mainly converted by the wavelength converting member 26 and a part of the light emitted from the bottom surface of the light emitting element 20 is mainly converted by the fluorescent material layer 56. The wavelength-converted light as described above and the original light from the light emitting element 20 are mixed to obtain light of a desired color. For example, in the case where the light emitting element 20 emits blue light and the wavelength converting member 30 emits yellow light, a white light can be obtained by mixing them.

One of the features in the present embodiment is found in the case where the fluorescent material layer 56 having the fluorescent material particles 54 dispersed therein is formed on the side surface 16a of the recess portion 16a to make the side surface of the recess portion 16a is a light scattering surface 18. That is, the fluorescent material particles 54 are dispersed in the side surface of the recess portion 16a of the package and a part of the incident light on the side surface is subjected to wavelength conversion and is also scattered by the fluorescent material particles 54. This allows increasing of the amount of light directly extracted from the light emitting element 20, and with providing the light scattering surface, also allows mixing of the colors of light emitted from the light emitting element 20 and the wavelength converted light which propagated through the wavelength converting member 30, and then extracting the light from the opening at the top plane of the recess portion 16a. Thus, the color unevenness can be suppressed and the light emission output can be improved.

One of the other features in the present embodiment is found in the case where the wavelength converting member 30 is disposed in the path from the light emitting element 20 to the top plane of the recess portion 16a, spaced apart from the light emitting element 20, and the wavelength converting member 30 is not present between the light emitting element 20 and the side surface of the bottom surface of the recess portion 16a. The wavelength converting member 30 is provided on the top surface of the light emitting element 20 so as to convert the wavelength of the light which is emitted from the light emitting element 20 and extracted to outside without being incident on the recess portion 16a of the package. The wavelength converting member 30 is not present between the light emitting element 20 and the side surface or the bottom surface of the recess portion 16a, therefore, the side surfaces and the bottom surface of the light emitting element 20 are exposed from the wavelength converting member 30, and thus the light extraction efficiency of the light emitted from the light emitting element can be improved. The light emitted sideward and downward from the light emitting element 20 undergoes wavelength conversion and scattering by the fluorescent material layer 56 constituting the light scattering surface 18, so that occurrence of color unevenness can also be suppressed.

Also, disposing the wavelength converting member 30 spaced apart from the light emitting element 20 allows them to be unaffected each other in respect to their temperature during operation, so that deterioration due to the heat can be prevented and the light emitting device with improved reliability can be obtained. Further, employing the light transmissive member 57 having thermal conductivity higher than that of the sealing member 28 enables to conduct heat of the wavelength converting member 30 to the light transmissive member 57. It is also possible that a metal casing for supporting the light transmissive member 57 is provided in the package so that the heat can be conducted through the metal casing.

The wavelength converting member 30 of the case of the present embodiment is also preferably made of an inorganic material. The wavelength converting member 30 is preferably projecting in a flange shape from the outer periphery of the light emitting element 20, and is preferably made in a plate shape. In the case where the wavelength converting member 30 has a plate-shape, a part of the light in the wavelength converting member 30 undergoes total internal reflection at the opposing two principal surfaces, and is emitted from the side surfaces.

In the case of the present embodiment, the wavelength converting member 30 and the light emitting element 20 are spaced apart from each other, so that a part of the light emitted from the light emitting element 20 may propagate between the wavelength converting member 30 and the light scattering surface 18 to directly reach the opening at the plane including the upper edge of the recess portion 16a. In such a case, as illustrated in FIG. 3, the light emitting device is constructed so that the light emitted from the light emitting element 20 propagates between the wavelength converting member 30 and the light scattering surface 18 to directly reach the top plane of the recess portion 16a is incident with an angle θc larger than the critical angle of total internal reflection at the surface of the sealing member 28 or the light transmissive member disposed in the recess at a position near or at the top plane of the recess portion 16a. The light returned in the recess portion 16a can be scattered at the light scattering surface 18. Thus, the light emitted from the light emitting element 20 is extracted from the top plane of the recess portion 16a after propagating through either the wavelength converting member 30 or the light scattering surface 18, so that color unevenness can be improved.

The structure may be such that with adjusting the width and/or position of the wavelength converting member 30 such as increasing the width of the wavelength converting member 30 or disposing it closer to the light emitting element 20, or with adjusting the inclination or the depth of the recess portion 16a, all the light emitted from the exposed side surfaces of the light emitting element 20 propagates through the wavelength converting member 30 or is scattered at the light scattering surface 18 and then extracted to the outside. That is, as shown in FIG. 4, the top edge of the regions where the direct light from the light emitting element 20 is incident may be located on the side surface of the recess portion 16a. As in the present embodiment, in the case where the separation distance between the wavelength converting member 30 and the light emitting element 20 is large, if the width of the wavelength converting member 30 is increased to a degree so that the light emitted from the light emitting element 20 is not directly emitted from top plane of the recess portion 16a, the distance between the wavelength converting member 30 and the side surface of the recess portion 16a becomes too small, and the regions where the light emitted from the wavelength converting member in lateral direction and the light emitted from the light emitting element 20 are directly incident become small. For this reason, in order to prevent direct emission of the light emitted from the light emitting element 20 to the outside of the recess portion 16a, as in the present embodiment, it is desirable that the light transmissive member 57 having approximately flat surfaces is disposed at the top plane of the recess portion 16a. With this arrangement, the light emitted from the light emitting element 20 and does not propagate the wavelength converting member 30 can be returned in the recess portion by total internal reflection at the interface of the light transmissive member 57. The structure may also be such that without providing the light transmissive member 57, only the sealing member 28 is filled in the recess portion and make the surface approximately flat. It si desirable that the surfaces of the light transmissive members 57 or the sealing members 28 described above are approximately in parallel to the top surface of the light emitting element 20.

Also in the present embodiment, the light emitting element 20 and the wavelength converting member 30 may be arranged so that an overlapping region where both the light emitted from the side surfaces of the light emitting element 20 and the side surfaces of the wavelength converting member 30 are directly incident can be provided in the facing region in the side surface of the recess portion 16a facing the light emitting element 20 and the wavelength converting member 30. As in the first embodiment, the light scattering surface 18 is preferably disposed in the overlapping region, further preferably to the portions over and below the overlapping region.

In the present embodiment, the distance d from the light emitting layer 38 to the bottom surface of the recess portion 16a is arranged to be larger than a certain distance, to increase the rate of utilization of the light emission from the bottom surface of the light emitting element 20. The path from the light emitting element 20 to the bottom surface (that is the mounting substrate 12) of the recess portion 16a serves as the heat releasing path of the light emitting element, so that in view of durability, the path is also formed with a material having high heat releasing property. In order to improve the heat releasing property, as shown in FIG. 10, it is preferable that the fluorescent material layer 56 is disposed on the side surface of the recess portion 16a, the mounting substrate 12 is exposed at the bottom of the recess portion 16a, and that the mounting substrate 12 and the light emitting element or the supporting substrate 32 are connected. Wirings 12a, 12b may be used as the member which is connected to the light emitting element 20 or the supporting substrate 32. In the case where the mounting substrate 12 is an insulating substrate, the heat releasing property can be improved by connecting to the wirings 12a, 12b made of a metal. Also, a heat dissipater such as a metal member which is insulated from the wirings 12a, 12b may be provided and the supporting member is disposed on the heat dissipater.

Meanwhile, the wavelength converting member is not present in the path from the light emitting layer 38 to the bottom surface of the recess portion 16a, so that a necessity arises that the light, in particular, emitted from the bottom surface of the light emitting element is wavelength converted and extracted to the outside without generating color unevenness. Therefore, in the present embodiment, the fluorescent material layer 56 containing fluorescent particles 54 is provided on the side surface of the recess portion 16a, and with it, wavelength conversion and scattering of the light emitted from the bottom surface and the side surfaces of the light emitting element 20 are performed at the same time. As in the present embodiment, in the case with a structure in which the wavelength converting member is not provided below the light emitting element 20, direct extracting of the light emission of the light emitting element 20 to the outside can be prevented by forming the light scattering surface with the fluorescent material layer.

In order to sufficiently suppress the color unevenness, the fluorescent material particles 54 is dispersed in the fluorescent layer 56 so that the light from the light emitting element 20 is scattered by the fluorescent material particles 54. For this, it is preferable that the average particle size of the fluorescent material particles 54 is 3 μm or greater, more preferably 10 μm or greater. Also, the difference in the refractive index between the fluorescent material particles 54 and the surrounding material is preferably greater than 0 and 0.4 or less. In this specification, the term "refractive index" indicates a refractive index at the emission wavelength of the light emitting element 20. Examples of the material of the fluorescent material particles 54 include the same kind of fluorescent material used in the wavelength converting member 30.

Examples of the material of the fluorescent material layer in which the fluorescent material particles to be dispersed include an organic material or an inorganic material having light transmissive property for light of the light emitting element 20. As the organic material, a resin having light transmissive property is preferable. For example, it is preferable to use a silicone resin composition and a modified silicone resin composition. But it is possible to use insulating resin compositions having transparency, such as an epoxy resin composition, a modified epoxy resin composition and an acrylic resin composition. It is also possible to utilize resins having excellent weatherability, such as a hybrid resin containing at least one kind of these resins. It is also possible to use, as the inorganic material, amorphous materials such as glass, inorganic crystals and ceramics.

In the present embodiment, the fluorescent layer 56 containing the fluorescent material particles 54 is preferably formed at least on a part of the side surface of the recess portion 16a, more preferably on the entire surface of the side surface. With this, in the case where the side surfaces of the light emitting element 20 are exposed from the wavelength converting member, the wavelength conversion and scattering of the light emitted from the side surfaces of the light emitting element 20 can be surely performed. In order to perform wavelength conversion and scattering of the light emitted from the bottom surface of the light emitting element 20, the side surface of the recess portion 16*a* is preferably covered with the fluorescent material layer 54 to it boundary with the bottom surface of the recess portion 16*a*. In the case where the recess portion is defined in a mortar shape with an inner diameter increases upwardly, the wavelength conversion and scattering of the light emitted from the bottom surface of the light emitting element 20 can also be facilitated. In the case to employ a structure having the side surface of the recess portion 16*a* covered with a fluorescent material layer 16*a*, it is suffice only to cover the inner surface of the side wall 14 with the fluorescent material layer 56, and thus the assembling the light emitting device 10 can be facilitated.

The fluorescent material layer 56 may be provided not only on the side surface of the recess portion 16*a* but also on the bottom surface of the recess portion 16*a*. However, the fluorescent material layer 56 is preferably not to be provided on a portion of the bottom surface of the recess portion 16*a* which is in the path from the light emitting element 20 to the bottom surface of the recess portion 16*a*. The portion from the light emitting element 20 to the bottom surface of the recess portion 16*a* serves as the heat releasing path of the light emitting element 20. Therefore, presence of the fluorescent material layer 56 in the path causes the heat dissipating efficiency to decrease and accelerates deterioration of the fluorescent material layer 56 itself.

In addition to the above-described yellow light emitting fluorescent material, the fluorescent material layer 56 containing the fluorescent material particles 54 and the wavelength converting member 30 may contain a fluorescent material capable of emitting light in a range from yellow to red. As described above, a multilayer structure having stacked layers having different fluorescent materials may also be employed. In this case, the wavelength converting member 30 preferably has a fluorescent material layer capable of emitting light disposed at a short wavelength at the light emitting element 20 side, and in contrast, the fluorescent material layer 56 preferably has a fluorescent material layer capable of emitting light disposed at a long wavelength at the light emitting element 20 side.

The side wall 14 in the case of the present embodiment is preferably made of a material having a high reflectance against the emission wavelength of the light emitting element 20. For example, by forming the side wall 14 disposed at an outer side from the fluorescent material layer 56 with a material having a lower refractive index than that of the fluorescent material layer 56, the reflectance at the interface between the fluorescent material layer 56 and the side wall 14 can be increased, and thus is preferable. The difference in the refractive index between the material of the side wall 14 and the material of the fluorescent material layer 56 is preferably 0.05 or greater, more preferably 0.1 or greater. For the material of the side wall 14, a silicone, an epoxy, or the like, can be used.

The embodiments described above are mere examples, and the present invention is not restricted to these embodiments. Components of the present invention are not limited to the constitution based on the members of the embodiments described above, and a plurality of components of the present invention may be constituted from a single member, or one component may be constituted from a plurality of members.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a housing member having a recess portion opening upward;
    a light emitting element disposed in the recess portion and comprising a light emitting layer comprising a semiconductor;
    a wavelength converting member disposed in the recess portion between the light emitting element and a top plane of the recess portion and configured to absorb part of light emitted from the light emitting element, convert the absorbed light into light of a different wavelength and emit the converted light, the light emitted from the light emitting element and the light converted by the wavelength converting member being mixed and emitted from an opening of the recess portion, the wavelength converting member having a plate shape; and
    a scattering surface provided on at least a portion of a side surface of the recess portion, which is irradiated with parallel incident light emitted from a side surface of the wavelength converting member and a side surface of the light emitting element, and configured to scatter the light emitted from the light emitting element and the light emitted from the wavelength converting member, said scattering surface being a surface of a material comprising a matrix material and light transmissive particles dispersed in the matrix material and having a different refractive index from a refractive index of the matrix material,
    wherein the light emitting element and the wavelength converting member are apart from the side surface of the recess portion,
    the side surface of the recess portion includes a beveled surface, and the beveled surface including the light scattering surface,
    a side surface of the light emitting element is not covered by the wavelength converting member, and
    light emitted from the side surface of the light emitting element and light converted by the wavelength converting member are scattered at the scattering surface and mixed with each other,
    wherein an entire space between said light emitting element and said scattering surface and between said wavelength converting member and said scattering surface is filled with a single optically transmissive member.

2. The light emitting device of claim 1, further comprising another wavelength converting member disposed between the light emitting element and a bottom surface of the recess portion.

3. The light emitting device of claim 1, wherein the wavelength converting member is disposed only between the light emitting element and the top plane of the opening of the recess portion.

4. The light emitting device of claim 1, wherein the wavelength converting member is separated away from the light emitting element toward the top plane of the recess portion.

5. The light emitting device of claim 1, wherein the particles comprise one of oxides of Ti, Zr, Nb, Al and Si, or comprise AlN or MgF, and the matrix material comprises a silicone, an epoxy or a glass.

6. The light emitting device of claim 1, wherein the light emitted from the light emitting element is released from an opening of the recess portion after passing through the wavelength converting member or being scattered at the scattering surface.

7. The light emitting device of claim 1, wherein the scattering surface is provided on at least a portion of the side surface of the recess portion which is irradiated with incident light emitted from the light emitting element and the wavelength converting member in a direction parallel to the top plane of the recess portion.

8. The light emitting device according to claim 1, wherein the scattering surface is provided on at least a portion of the side surface of the recess portion which is irradiated with incident light emitted from a side surface of the wavelength converting member and a side surface of the light emitting element in a direction parallel to the top plane of the recess portion.

9. The light emitting device of claim 1, wherein a portion of the side surface of the recess portion which is irradiated with the incident light emitted from the side surface of the wavelength converting member is included in a portion of the side surface of the recess portion which is irradiated with the incident light emitted from the side surface of the light emitting element.

10. The light emitting device of claim 1, wherein an angle $\beta$ formed by an optical axis of the recess portion and a line connecting a center of the light emitting layer and a top edge of the recess portion is $30°<\beta<90°$.

11. The light emitting device of claim 10, wherein the side surface of the recess portion includes a beveled surface from the top edge toward the center of the recess portion, and the beveled surface is the light scattering surface.

12. The light emitting device of claim 1, wherein the housing member comprises a mounting substrate and a side wall formed on the mounting substrate, the light emitting element is mounted on the mounting substrate, and the light scattering surface is formed on the side wall.

13. The light emitting device of claim 1, wherein the recess portion is formed in a shape with an inner diameter increasing toward the top plane.

* * * * *

UNITED STATES PATENT AND TRADEMARK OFFICE
CERTIFICATE OF CORRECTION

| | | |
|---|---|---|
| PATENT NO. | : 8,723,409 B2 | Page 1 of 1 |
| APPLICATION NO. | : 13/079272 | |
| DATED | : May 13, 2014 | |
| INVENTOR(S) | : Masatsugu Ichikawa | |

It is certified that error appears in the above-identified patent and that said Letters Patent is hereby corrected as shown below:

On the Title Page:

Item (75), the inventor's name is spelled incorrectly. Please correct the name spelling from "Masatsuga Ichikawa" to:

-- Masatsugu Ichikawa --

Signed and Sealed this
Ninth Day of September, 2014

Michelle K. Lee
*Deputy Director of the United States Patent and Trademark Office*